United States Patent
Im et al.

(10) Patent No.: US 10,446,627 B2
(45) Date of Patent: Oct. 15, 2019

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Jonghyeok Im, Busan (KR); SeJune Kim, Paju-si (KR); Joonsuk Lee, Seoul (KR); SoJung Lee, Paju-si (KR); Jin-Hee Jang, Seoul (KR); JaeSung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/035,308

(22) Filed: Jul. 13, 2018

(65) Prior Publication Data

US 2018/0323244 A1 Nov. 8, 2018

Related U.S. Application Data

(62) Division of application No. 15/166,970, filed on May 27, 2016, now Pat. No. 10,056,440.

(30) Foreign Application Priority Data

May 28, 2015 (KR) .................. 10-2015-0075394
Oct. 30, 2015 (KR) .................. 10-2015-0152626

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 27/3279* (2013.01);
(Continued)

(58) Field of Classification Search
None
See application file for complete search history.

(56) References Cited

U.S. PATENT DOCUMENTS

| | | | |
|---|---|---|---|
| 2007/0075313 A1 | 4/2007 | Kwak et al. | |
| 2008/0309233 A1 | 12/2008 | Hasegawa et al. | |

(Continued)

FOREIGN PATENT DOCUMENTS

| | | |
|---|---|---|
| CN | 101315945 A | 12/2008 |
| CN | 104124259 A | 10/2014 |
| CN | 104253144 A | 12/2014 |

*Primary Examiner* — Lex H Malsawma
(74) *Attorney, Agent, or Firm* — Birch, Stewart, Kolasch & Birch, LLP

(57) ABSTRACT

A method of manufacturing an organic light emitting display device can include providing a source electrode, a drain electrode and a signal pad on a substrate; providing a passivation layer on the source electrode, the drain electrode and the signal pad, providing a planarization layer on the passivation layer; providing a anode electrode connected with the source electrode or drain electrode, and providing an auxiliary electrode spaced apart from the anode electrode; providing a contact hole for exposing the signal pad by removing a predetermined portion of the passivation layer; providing a bank on one side and the other side of the anode electrode and one side and the other side of the auxiliary electrode; providing an organic emitting layer on the anode electrode; and providing a cathode electrode connected with the auxiliary electrode and provided on the organic emitting layer, in which the signal pad includes a lower signal pad, a central signal pad and an upper signal pad, and the central signal pad is surrounded by the lower signal pad, the upper signal pad and the passivation layer.

20 Claims, 12 Drawing Sheets

(52) U.S. Cl.
CPC ...... *H01L 51/5228* (2013.01); *H01L 51/5237* (2013.01); *H01L 2251/5315* (2013.01)

(56) References Cited

U.S. PATENT DOCUMENTS

| | | | |
|---|---|---|---|
| 2010/0213482 A1 | 8/2010 | Kim et al. | |
| 2013/0056784 A1* | 3/2013 | Lee | H01L 27/3279 257/99 |
| 2014/0312323 A1 | 10/2014 | Park et al. | |
| 2014/0346448 A1* | 11/2014 | You | H01L 51/5228 257/40 |
| 2015/0001507 A1 | 1/2015 | Kim et al. | |
| 2016/0013436 A1* | 1/2016 | Im | H01L 51/5206 257/40 |
| 2016/0020422 A1* | 1/2016 | Kim | H01L 51/5228 257/40 |
| 2016/0247870 A1* | 8/2016 | Park | H01L 27/3265 |

* cited by examiner

ORGANIC LIGHT EMITTING DISPLAY DEVICE AND METHOD OF MANUFACTURING THE SAME

CROSS REFERENCE TO RELATED APPLICATIONS

This application is a Divisional of U.S. patent application Ser. No. 15/166,970 filed on May 27, 2016, which claims the priority benefit of the Korean Patent Application No. 10-2015-0075394 filed in the Republic of Korea on May 28, 2015, and the Korean Patent Application No. 10-2015-0152626 filed in the Republic of Korea on Oct. 30, 2015, all of which are hereby expressly incorporated by reference into the present application.

BACKGROUND

Field of the Disclosure

Embodiments of the present invention relate to an organic light emitting display device, and more particularly, to a top emission type organic light emitting display device, and a method of manufacturing the same.

Discussion of the Related Art

An organic light emitting display (OLED) device, which is a self light emitting display device, has advantages of low power consumption, rapid response speed, high emission efficiency, high luminance and wide viewing angle.

According to a direction of light emitted from an organic light emitting device, the OLED device may be largely classified into a top emission type and a bottom emission type. In case of the bottom emission type, a circuit device is disposed between an emitting layer and an image displaying surface, whereby an aperture ratio may be lowered due to the circuit device. Meanwhile, in case of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15 and a drain electrode 16 is provided on an active area (AA) of a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 80 to be explained later.

On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In case of the top emission type, light emitted from the organic emitting layer 70 passes through the cathode electrode 80. In this reason, the cathode electrode 80 is formed of a transparent conductive material, which causes the increase of resistance therein. In order to lower the resistance of the cathode electrode 80, the cathode electrode 80 is connected with the auxiliary electrode 50.

On a pad area (PA) of the substrate 10, there are the gate insulating film 12 and the insulating interlayer 14. A signal pad 90 is provided on the insulating interlayer 14, and the passivation layer 20 is provided on the signal pad 90. A contact hole is provided in the passivation layer 20 so that the signal pad 90 is exposed to the external via the contact hole. A pad electrode 95 is provided on the passivation layer 20. The pad electrode 95 is connected with the signal pad 90 exposed via the contact hole.

However, the related art top emission type organic light emitting display device may have the following disadvantages.

The pad electrode 95 is manufactured for a process of manufacturing the anode electrode 40, whereby the pad electrode 95 is formed of the same material as that of the anode electrode 40. In this case, the anode electrode 40 is formed of a metal material with good reflectance, for example, argentums (Ag) so as to reflect the light emitted from the organic emitting layer 70 toward the cathode electrode 80. However, the metal material with good reflectance, for example, argentums (Ag) is vulnerable to corrosion. A lateral side of the anode electrode 40 is covered by the bank 60, and an upper surface of the anode electrode 40 is covered by the organic emitting layer 70, so that it is possible to prevent the anode electrode 40 from being corroded. However, the pad electrode 95 is exposed to the external, and connected with an external driver, whereby the pad electrode 95 is corroded.

Further, in order to prevent the corrosion, an upper surface of the pad electrode 95 may be formed of a corrosion-resistant material. Even in this case, it is difficult to prevent a lateral side of the pad electrode 95 from being corroded.

SUMMARY

Accordingly, the embodiments of the present invention are directed to a top emission type organic light emitting display device that substantially obviates one or more problems due to limitations and disadvantages of the related art.

An aspect of the embodiments of the present invention is directed to provide a top emission type organic light emitting display device which is capable of preventing a pad electrode from being corroded, and a method of manufacturing the same.

In order to achieve the above purpose, the organic light emitting display device according to one embodiment of the present invention includes an active area and a pad area on a substrate, wherein the active area includes an anode electrode, an organic emitting layer, a cathode electrode, and an auxiliary electrode connected with the cathode electrode and provided in the same layer as the anode electrode, and the pad area includes a signal pad, and a passivation layer for covering a lateral surface of the signal pad, wherein the passivation layer has a contact hole for exposing an upper surface of the signal pad. The signal pad includes a lower signal pad, a central signal pad, and an upper signal pad. The central signal pad is surrounded by the lower signal pad, the upper signal pad, and the passivation layer.

Also, the organic light emitting display device according to one embodiment of the present invention is manufactured by providing a source electrode, a drain electrode and a signal pad on a substrate; providing a passivation layer on the source electrode, the drain electrode and the signal pad, providing a planarization layer on the passivation layer, and providing a contact hole for exposing the source electrode or drain electrode by removing predetermined portions of the passivation layer and the planarization layer; providing a first anode electrode connected with the source electrode or drain electrode, and providing a first auxiliary electrode spaced apart from the first anode electrode; providing a second anode electrode for covering upper and lateral surfaces of the first anode electrode, and providing a second auxiliary electrode for covering upper and lateral surfaces of the first auxiliary electrode; providing a contact hole for exposing the signal pad by removing a predetermined portion of the passivation layer; providing a bank on one side and the other side of the second anode electrode and one side and the other side of the second auxiliary electrode; providing an organic emitting layer on the second anode electrode; and providing a cathode electrode connected with the second auxiliary electrode on the organic emitting layer.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE EMBODIMENTS

Figure 1:
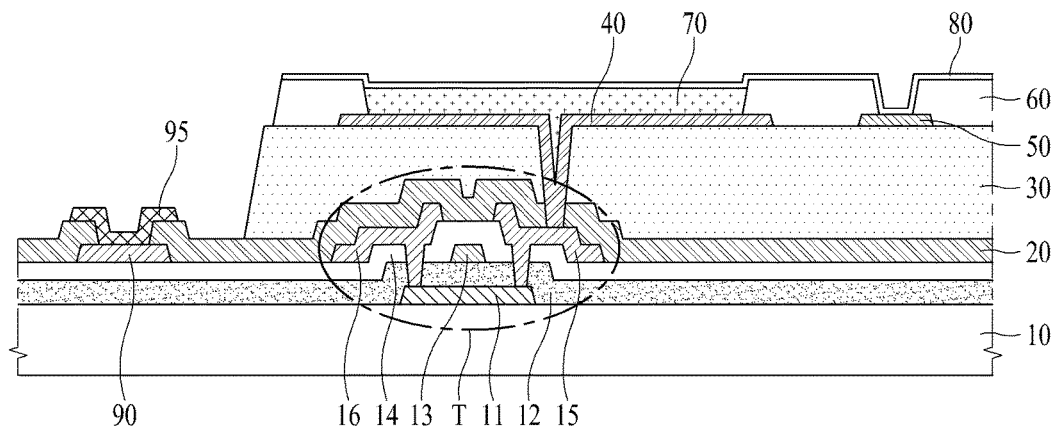
FIG. 1 is a cross sectional view illustrating a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error region although there is no explicit description.

In description of embodiments of the present invention, when a structure is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after-', 'subsequent-', 'next-', and 'before-', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present invention will be described in detail with reference to the accompanying drawings.

Figure 2:
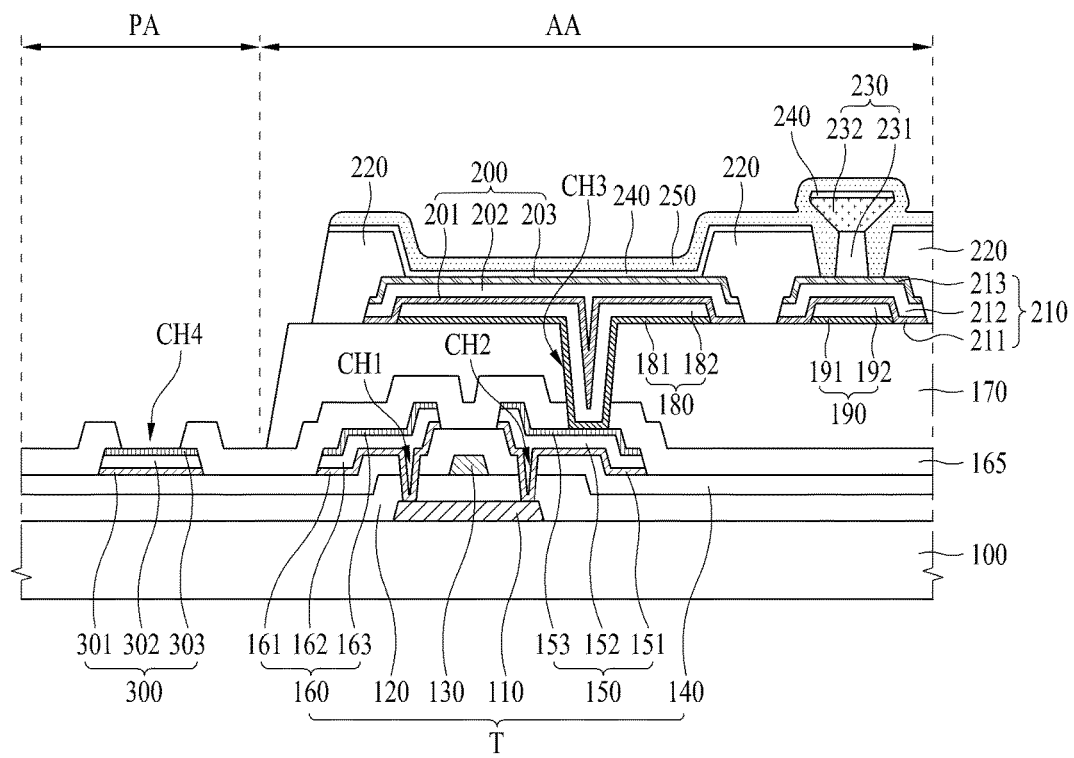
FIG. 2 is a cross sectional view illustrating an organic light emitting display device according to one embodiment of the present invention.

FIG. 2 is a cross sectional view illustrating an organic light emitting display device according to one embodiment of the present invention. All the components of the organic light emitting display device according to all embodiments of the present invention are operatively coupled and configured.

As shown in FIG. 2, the organic light emitting display device according to one embodiment of the present invention may include an active area (AA) and a pad area (PA) on a substrate 100.

In the active area (AA) of the substrate 100, there are a thin film transistor layer (T), a passivation layer 165, a planarization layer 170, a first anode electrode 180, a second anode electrode 200, a first auxiliary electrode 190, a second auxiliary electrode 210, a bank 220, a partition 230, an organic emitting layer 240, and a cathode electrode 250.

The thin film transistor layer (T) may include an active layer 110, a gate insulating film 120, a gate electrode 130, an insulating interlayer 140, a source electrode 150, and a drain electrode 160.

The active layer 110 is provided on the substrate 100, wherein the active layer 110 overlaps with the gate electrode 130. The active layer 110 may be formed a silicon-based semiconductor material or oxide-based semiconductor material. A light shielding layer may be additionally provided between the substrate 100 and the active layer 110. In this case, external light, which is incident on a lower surface of the substrate 100, is blocked by the light shielding layer so that it is possible to prevent the active layer 110 from being damaged by the external light.

The gate insulating film 120 is provided on the active layer 110. The gate insulating film 120 insulates the active layer 110 and the gate electrode 130 from each other. For example, the gate insulating film 120 may be formed of an inorganic insulating material, and more particularly, the gate insulating film 120 may be formed in a single-layered structure of the inorganic insulating material such as silicon oxide (SiOx) or silicon nitride (SiNx), or a multi-layered structure of the above silicon oxide (SiOx) and silicon nitride (SiNx), but is not limited to these structures. The gate insulating film 120 may extend to the pad area (PA).

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but is not limited to these materials.

The insulating interlayer 140 is provided on the gate electrode 130. The insulating interlayer 140 is formed of the same material as that of the gate insulating film 120. For example, the insulating interlayer 140 may be formed in a single-layered structure of the inorganic insulating material such as silicon oxide (SiOx) or silicon nitride (SiNx), or a multi-layered structure of the above silicon oxide (SiOx) and silicon nitride (SiNx), but is not limited to these materials and structures. The insulating interlayer 140 may extend to the pad area (PA).

The source electrode 150 and the drain electrode 160 confronting each other are provided on the insulating interlayer 140. A first contact hole (CH1) for exposing one end of the active layer 110 is provided in the aforementioned gate insulating film 120 and the insulating interlayer 140, and a second contact hole (CH2) for exposing the other end of the active layer 110 is provided in the aforementioned gate insulating film 120 and the insulating interlayer 140. The source electrode 150 is connected with the other end of the active layer 110 via the second contact hole (CH2), and the drain electrode 160 is connected with one end of the active layer 110 via the first contact hole (CH1).

The source electrode 150 may include a lower source electrode 151, a central source electrode 152, and an upper source electrode 153.

The lower source electrode 151 is provided between the insulating interlayer 140 and the central source electrode 152, wherein the lower source electrode 151 enhances an adhesive strength between the insulating interlayer 140 and the central source electrode 152. Also, the lower source electrode 151 protects a lower surface of the central source electrode 152 so that it is possible to prevent the lower surface of the central source electrode 152 from being corroded. Thus, an oxidation degree of the lower source electrode 151 may be lower than an oxidation degree of the central source electrode 152. That is, a corrosion resistance in a material of the lower source electrode 151 may be superior to a corrosion resistance in a material of the central source electrode 152. The lower source electrode 151 functions as an adhesion enhancement layer or a corrosion preventing layer. The lower source electrode 151 may be formed of an alloy (MoTi) of molybdenum and titanium, but is not limited to this material.

The central source electrode 152 is provided between the lower source electrode 151 and the upper source electrode 153. The central source electrode 152 may be formed of a low-resistance metal material such as copper (Cu), but is not limited to this metal material. The central source electrode 152 may be formed of a metal material whose resistance is relatively lower than that of the lower source electrode 151 and the upper source electrode 153. In order to lower a total resistance of the source electrode 150, a thickness of the central source electrode 152 is larger than a thickness of each of the lower source electrode 151 and the upper source electrode 153, preferably.

The upper source electrode 153 is provided on an upper surface of the central source electrode 152, wherein the upper source electrode 153 prevents the upper surface of the central source electrode 152 from being corroded. Thus, an oxidation degree of the upper source electrode 153 may be lower than an oxidation degree of the central source electrode 152. That is, a corrosion resistance in a material of the upper source electrode 153 may be superior to a corrosion resistance in a material of the central source electrode 152. The upper source electrode 153 may be formed of a transparent conductive material, for example, indium-tin oxide (ITO), but is not limited to this material.

In the same way as the aforementioned source electrode 150, the drain electrode 160 may include a lower drain electrode 161, a central drain electrode 162, and an upper drain electrode 163.

The lower drain electrode 161 is provided between the insulating interlayer 140 and the central drain electrode 162, wherein the lower drain electrode 161 enhances an adhesive strength between the insulating interlayer 140 and the central drain electrode 162. Also, the lower drain electrode 161 prevents a lower surface of the central drain electrode 162 from being corroded. Thus, an oxidation degree of the lower drain electrode 161 may be lower than an oxidation degree of the central drain electrode 162. That is, a corrosion resistance in a material of the lower drain electrode 161 may be superior to a corrosion resistance in a material of the central drain electrode 162. The lower drain electrode 161 may be formed of the same material as that of the aforementioned lower source electrode 151, that is, alloy (MoTi) of molybdenum and titanium, but is not limited to this material.

The central drain electrode 162 is provided between the lower drain electrode 161 and the upper drain electrode 163. The central drain electrode 162 may be formed of the same material as that of the aforementioned central source electrode 152, for example, copper (Cu), but is not limited to this material. The central drain electrode 162 may be formed of a metal material whose resistance is relatively lower than that of the lower drain electrode 161 and the upper drain electrode 163. In order to lower a total resistance of the drain electrode 160, a thickness of the central drain electrode 162 is larger than a thickness of each of the lower drain electrode 161 and the upper drain electrode 163, preferably.

The upper drain electrode 163 is provided on an upper surface of the central drain electrode 162, wherein the upper drain electrode 163 prevents the upper surface of the central drain electrode 162 from being corroded. Thus, an oxidation degree of the upper drain electrode 163 may be lower than an oxidation degree of the central drain electrode 162. That is, a corrosion resistance in a material of the upper drain electrode 163 may be superior to a corrosion resistance in a material of the central drain electrode 162. The upper drain electrode 163 may be formed of a transparent conductive material, for example, indium-tin oxide (ITO), but is not limited to this material.

The upper drain electrode 163 may be formed of the same material as that of the upper source electrode 153, and the upper drain electrode 163 may be formed in the same thickness as that of the upper source electrode 153. The central drain electrode 162 may be formed of the same material as that of the central source electrode 152, and the central drain electrode 162 may be formed in the same thickness as that of the central source electrode 152. The lower drain electrode 161 may be formed of the same material as that of the lower source electrode 151, and the lower drain electrode 161 may be formed in the same thickness as that of the lower source electrode 151. In this case, the drain electrode 160 and the source electrode 150 may be simultaneously manufactured in the same process.

A structure of the thin film transistor layer (T) is not limited to the above structure, that is, a structure of the thin film transistor layer (T) may be changed to various shapes generally known to those in the art. For example, the drawing shows a top gate structure where the gate electrode 130 is provided on the active layer 110, but is not necessarily. That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 may be formed of an inorganic insulating material, for example, silicon oxide film (SiOx) or silicon nitride film (SiNx), but is not limited to these materials. The passivation layer 165 may extend to the pad area (PA).

The planarization layer 170 is provided on the passivation layer 165. The planarization layer 170 is provided to planarize an upper surface of the substrate 100 with the thin film transistor layer (T). The planarization layer 170 may be formed of an organic insulating material, for example, acryl resin, epoxy resin, phenolic resin, polyamide resin, polyimide resin, and etc., but is not limited to these materials. The planarization layer 170 may not extend to the pad area (PA).

The first anode electrode 180 and the first auxiliary electrode 190 are provided on the planarization layer 170. That is, the first anode electrode 180 and the first auxiliary electrode 190 are formed in the same layer. A third contact hole (CH3) for exposing the source electrode 150 is provided in the aforementioned passivation layer 165 and the planarization layer 170. The source electrode 150 and the first anode electrode 180 are connected with each other via the third contact hole (CH3). If needed, the third contact hole (CH3) may expose the drain electrode 160, whereby the drain electrode 160 and the first anode electrode 180 may be connected with each other via the third contact hole (CH3).

The first anode electrode 180 may include a first lower anode electrode 181, and a first upper anode electrode 182.

The first lower anode electrode 181 is provided between the planarization layer 170 and the first upper anode electrode 182, wherein the first lower anode electrode 181 enhances an adhesive strength between the planarization layer 170 and the first upper anode electrode 182. Also, the first lower anode electrode 181 protects a lower surface of the first upper anode electrode 182, to thereby prevent the lower surface of the first upper anode electrode 182 from being corroded. Thus, an oxidation degree of the first lower anode electrode 181 may be lower than an oxidation degree of the first upper anode electrode 182. That is, a corrosion resistance in a material of the first lower anode electrode 181 may be superior to a corrosion resistance in a material of the first upper anode electrode 182. The first lower anode electrode 181 functions as an adhesion enhancement layer or a corrosion preventing layer. The first lower anode electrode 181 may be formed of an alloy (MoTi) of molybdenum and titanium, but is not limited to this material.

The first upper anode electrode 182 is provided on an upper surface of the first lower anode electrode 181. The first upper anode electrode 182 may be formed of a low-resistance metal material, for example, copper (Cu), but is not limited to this material. The first upper anode electrode 182 may be formed of a metal material whose resistance is relatively lower than that of the first lower anode electrode 181. In order to reduce a total resistance of the first anode electrode 180, a thickness of the first upper anode electrode 182 is larger than a thickness of the first lower anode electrode 181, preferably.

In the same way as the aforementioned first anode electrode 180, the first auxiliary electrode 190 may include a first lower auxiliary electrode 191, and a first upper auxiliary electrode 192.

The first lower auxiliary electrode 191 is provided between the planarization layer 170 and the first upper auxiliary electrode 192, wherein the first lower auxiliary electrode 191 enhances an adhesive strength between the planarization layer 170 and the first upper auxiliary electrode 192. Also, the first lower auxiliary electrode 191 protects a lower surface of the first upper auxiliary electrode 192, to thereby prevent the lower surface of the first upper auxiliary electrode 192 from being corroded. Thus, an oxidation degree of the first lower auxiliary electrode 191 may be lower than an oxidation degree of the first upper auxiliary electrode 192. That is, a corrosion resistance in a material of the first lower auxiliary electrode 191 may be superior to a corrosion resistance in a material of the first upper auxiliary electrode 192. The first lower auxiliary electrode 191 may be formed of the same material as that of the aforementioned first lower anode electrode 181, for example, alloy (MoTi) of molybdenum and titanium, but is not limited to this material.

The first upper auxiliary electrode 192 is provided on an upper surface of the first lower auxiliary electrode 191. The first upper auxiliary electrode 192 may be formed of the same material as that of the aforementioned first upper anode electrode 182, for example, copper (Cu), but is not limited to this material. Preferably, a thickness of the first upper auxiliary electrode 192 with a relatively low resistance is larger than a thickness of the first lower auxiliary electrode 191 with a relatively high resistance, to thereby reduce a total resistance of the first auxiliary electrode 190.

The first upper auxiliary electrode 192 may be formed of the same material as that of the first upper anode electrode 182, and the first upper auxiliary electrode 192 may be formed in the same thickness as that of the first upper anode electrode 182. The first lower auxiliary electrode 191 may be formed of the same material as that of the first lower anode electrode 181, and the first lower auxiliary electrode 191 may be formed in the same thickness as that of the first lower anode electrode 181. In this case, the first auxiliary electrode 190 and the first anode electrode 180 may be simultaneously manufactured in the same process.

The second anode electrode 200 is provided on an upper surface of the first anode electrode 180. The second anode electrode 200 is in contact with entire upper and lateral surfaces of the first anode electrode 180. That is, an additional insulating layer is not provided between the first anode electrode 180 and the second anode electrode 200, whereby it is possible to omit a process for forming an insulating layer and a contact hole. The second anode electrode 200 reflects the light emitted from the organic emitting layer 240 to an upper direction, whereby the second anode electrode 200 includes a material with good reflectance. Also, the second anode electrode 200 covers the upper and lateral surfaces of the first anode electrode 180, to thereby prevent the upper and lateral surfaces of the first anode electrode 180 from being corroded.

The second anode electrode 200 may include a second lower anode electrode 201, a second central anode electrode 202, and a second upper anode electrode 203.

The second lower anode electrode 201 is provided between the first anode electrode 180 and the second central anode electrode 202. The second lower anode electrode 201 covers the upper and lateral surfaces of the first anode electrode 180, to thereby prevent the first anode electrode 180 from being corroded. Thus, an oxidation degree of the second lower anode electrode 201 may be lower than an oxidation degree of each of the first lower anode electrode 181 and the first upper anode electrode 182 included in the first anode electrode 180. That is, a corrosion resistance in a material of the second lower anode electrode 201 may be superior to a corrosion resistance in a material of each of the first lower anode electrode 181 and the first upper anode electrode 182 included in the first anode electrode 180. Also, the second lower anode electrode 201 protects a lower surface of the second central anode electrode 202, to thereby prevent the lower surface of the second central anode electrode 202 from being corroded. Thus, an oxidation degree of the second lower anode electrode 201 may be lower than an oxidation degree of the second central anode electrode 202. That is, a corrosion resistance in a material of the second lower anode electrode 201 may be superior to a corrosion resistance in a material of the second central anode electrode 202. The second lower anode electrode 201 may be formed of a transparent conductive material, for example, indium-tin-oxide (ITO), but is not limited to this material.

The second central anode electrode 202 is provided between the second lower anode electrode 201 and the second upper anode electrode 203. The second central anode electrode 202 is formed of a material with relatively-low resistance and relatively-high reflectance in comparison to the second lower anode electrode 201 and the second upper anode electrode 203, for example, argentums or silver (Ag), but is not limited to this material. Preferably, a thickness of the second central anode electrode 202 with the relatively low resistance is larger than a thickness of each of the second lower anode electrode 201 and the second upper anode electrode 203 with the relatively high resistance, to thereby reduce a total resistance of the second anode electrode 200.

The second upper anode electrode 203 is provide on an upper surface of the second central anode electrode 202, to thereby prevent the upper surface of the second central anode electrode 202 from being corroded. Thus, an oxidation degree of the second upper anode electrode 203 may be lower than an oxidation degree of the second central anode electrode 202. That is, a corrosion resistance in a material of the second upper anode electrode 203 may be superior to a corrosion resistance in a material of the second central anode electrode 202. The second upper anode electrode 203 may be formed of a transparent conductive material, for example, indium-tin-oxide (ITO), but is not limited to this material.

The second auxiliary electrode 210 is provided on an upper surface of the first auxiliary electrode 190. The second auxiliary electrode 210 is formed in the same layer as that of the aforementioned second anode electrode 200. The second auxiliary electrode 210 is in contact with entire upper and lateral surfaces of the first auxiliary electrode 190. That is, an additional insulating layer is not provided between the second auxiliary electrode 210 and the first auxiliary electrode 190, whereby it is possible to omit a process for forming an insulating layer and a contact hole. The second auxiliary electrode 210 together with the first auxiliary electrode 190 may lower a resistance of the cathode electrode 250. According to one embodiment of the present invention, the two auxiliary electrodes of the first auxiliary electrode 190 and the second auxiliary electrode 210 are deposited so as to lower the resistance of the cathode electrode 250, whereby it is possible to control the resistance properties needed for the auxiliary electrode with easiness. In more detail, since the first auxiliary electrode 190 and the first anode electrode 180 are formed in the same layer, it causes a limitation on the size increase of the first auxiliary electrode 190. According to one embodiment of the present invention, the second auxiliary electrode 210 is deposited on the first auxiliary electrode 190 so that it is possible to effectively lower the resistance of the cathode electrode 250. Also, the second auxiliary electrode 210 covers the upper and lateral surfaces of the first auxiliary electrode 190, to thereby prevent the upper and lateral surfaces of the first auxiliary electrode 190 from being corroded.

The second auxiliary electrode 210 may include a second lower auxiliary electrode 211, a second central auxiliary electrode 212, and a second upper auxiliary electrode 213.

The second lower auxiliary electrode 211 is provided between the first auxiliary electrode 190 and the second central auxiliary electrode 212. The second lower auxiliary electrode 211 covers the upper and lateral surfaces of the first auxiliary electrode 190, to thereby prevent the first auxiliary electrode 190 from being corroded. Thus, an oxidation degree of the second lower auxiliary electrode 211 may be lower than an oxidation degree of each of the first lower auxiliary electrode 191 and the first upper auxiliary electrode 192 included in the first auxiliary electrode 190. That is, a corrosion resistance in a material of the second lower auxiliary electrode 211 may be superior to a corrosion resistance in a material of each of the first lower auxiliary electrode 191 and the first upper auxiliary electrode 192. Also, the second lower auxiliary electrode 211 protects a lower surface of the second central auxiliary electrode 212, to thereby prevent the lower surface of the second central auxiliary electrode 212 from being corroded. Thus, an oxidation degree of the second lower auxiliary electrode 211 may be lower than an oxidation degree of the second central auxiliary electrode 212. That is, a corrosion resistance in a material of the second lower auxiliary electrode 211 may be superior to a corrosion resistance in a material of the second central auxiliary electrode 212. The second lower auxiliary electrode 211 may be formed of a transparent conductive material, for example, indium-tin-oxide (ITO), but is not limited to this material.

The second central auxiliary electrode 212 is provided between the second lower auxiliary electrode 211 and the second upper auxiliary electrode 213. The second central auxiliary electrode 212 is formed of a material with relatively-low resistance and relatively-high reflectance in comparison to the second lower auxiliary electrode 211 and the second upper auxiliary electrode 213, for example, argentums or silver (Ag), but is not limited to this material. Preferably, a thickness of the second central auxiliary electrode 212 with the relatively low resistance is larger than a thickness of each of the second lower auxiliary electrode 211 and the second upper auxiliary electrode 213 with the relatively high resistance, to thereby reduce a total resistance of the second auxiliary electrode 210.

The second upper auxiliary electrode 213 is provide on an upper surface of the second central auxiliary electrode 212, to thereby prevent the upper surface of the second central auxiliary electrode 212 from being corroded. Thus, an oxidation degree of the second upper auxiliary electrode 213 may be lower than an oxidation degree of the second central auxiliary electrode 212. That is, a corrosion resistance in a material of the second upper auxiliary electrode 213 may be superior to a corrosion resistance in a material of the second central auxiliary electrode 212. The second upper auxiliary electrode 213 may be formed of a transparent conductive material, for example, indium-tin-oxide (ITO), but is not limited to this material.

The second upper auxiliary electrode 213 may be formed of the same material as that of the second upper anode electrode 203, and the second upper auxiliary electrode 213 may be formed in the same thickness as that of the second upper anode electrode 203. The second central auxiliary electrode 212 may be formed of the same material as that of the second central anode electrode 202, and the second central auxiliary electrode 212 may be formed in the same thickness as that of the second central anode electrode 202. The second lower auxiliary electrode 211 may be formed of the same material as that of the second lower anode electrode 201, and the second lower auxiliary electrode 211 may be formed in the same thickness as that of the second lower anode electrode 201. In this case, the second auxiliary electrode 210 and the second anode electrode 200 may be simultaneously manufactured in the same process.

The bank 220 is provided on the second anode electrode 200 and the second auxiliary electrode 210.

The bank 220, which exposes the upper surface of the second anode electrode 200, is provided on one side and the other side of the second anode electrode 200. According as the bank 220 is provided to expose the upper surface of the second anode electrode 200, it is possible to secure an image-displaying area. Also, the bank 220 is provided on one side and the other side of the second anode electrode 200 so that it is possible to prevent the lateral surface of the second central anode electrode 202 from being exposed to the external, wherein the lateral surface of the second central anode electrode 202 is relatively vulnerable to corrosion, thereby preventing the lateral surface of the second central anode electrode 202 from being corroded.

The bank 220, which exposes the upper surface of the second auxiliary electrode 210, is provided on one side and the other side of the second auxiliary electrode 210. According as the bank 220 is provided to expose the upper surface of the second auxiliary electrode 210, it is possible to secure an electrical connection space between the second auxiliary electrode 210 and the cathode electrode 250. Also, the bank 220 is provided on one side and the other side of the second auxiliary electrode 210 so that it is possible to prevent the lateral surface of the second central auxiliary electrode 212 from being exposed to the external, wherein the lateral surface of the second central auxiliary electrode 212 is relatively vulnerable to corrosion, thereby preventing the lateral surface of the second central auxiliary electrode 212 from being corroded.

Also, the bank 220 is provided between the second anode electrode 200 and the second auxiliary electrode 210, to thereby insulate the second anode electrode 200 and the second auxiliary electrode 210 from each other. The bank 220 may be formed of an organic insulating material, for example, polyimide resin, acryl resin, benzocyclobutene BCB, and etc., but is not limited to these materials.

The partition 230 is provided on the second auxiliary electrode 210. The partition 230 is spaced apart from the bank 220, and the second auxiliary electrode 210 and the cathode electrode 250 are electrically connected with each other through the space between the partition 230 and the bank 220. The second auxiliary electrode 210 and the cathode electrode 250 may be electrically connected with each other without forming the partition 230. However, if forming the partition 230, it facilitates a deposition process of the organic emitting layer 240. This will be described in detail as follows.

In case the partition 230 is not formed, it is necessary to provide a mask pattern for covering the upper surface of the second auxiliary electrode 210 when the organic emitting layer 240 is deposited to prevent the upper surface of the second auxiliary electrode 210 from being covered. However, if forming the partition 230, an upper surface of the partition 230 serves as eaves for the deposition process of the organic emitting layer 240. Thus, the organic emitting layer 240 is not deposited in an area below the eaves so that there is no need to provide the mask pattern for covering the upper surface of the second auxiliary electrode 210. From a front view, if the upper surface of the partition 230 serving as the eaves is configured to cover the space between the partition 230 and the bank 220, it is possible to prevent the organic emitting layer 240 from being permeated into the space between the partition 230 and the bank 220. Thus, the second auxiliary electrode 210 may be exposed in the space between the partition 230 and the bank 220. Especially, the organic emitting layer 240 may be manufactured by an evaporation method using a deposition material with superior straightness. Thus, the organic emitting layer 240 is not deposited in the space between the partition 230 and the bank 220 for the deposition process of the organic emitting layer 240.

As described above, in order to provide the partition 230 whose upper surface serves as the eaves, a width in the upper surface of the partition 230 is larger than a width in the lower surface of the partition 230. The partition 230 may include a first partition 231 of the lower side and a second partition 232 of the upper side. The first partition 231 is provided on the upper surface of the second auxiliary electrode 210. The first partition 231 may be formed of the same material as that of the bank 220, and the first partition 231 and the bank 220 may be manufactured in the same process. The second partition 232 is provided on an upper surface of the first partition 231. A width in the upper surface of the second partition 232 is larger than a width in the lower surface of the second partition 232. Especially, the upper surface of the second partition 232 is configured to cover the space between the partition 230 and the bank 220, whereby the partition 230 serves as the eaves.

The organic emitting layer 240 is provided on the second anode electrode 200. The organic emitting layer 240 may include a hole injecting layer, a hole transporting layer, an emitting layer, an electron transporting layer and an electron injecting layer. A structure of the organic emitting layer 240 may be changed to various shapes generally known to those in the art.

The organic emitting layer 240 may extend to the upper surface of the bank 220. However, when the organic emitting layer 240 extends to the upper surface of the bank 220, the upper surface of the second auxiliary electrode 210 is not covered by the organic emitting layer 240. If the upper surface of the second auxiliary electrode 210 is covered by the organic emitting layer 240, it is difficult to electrically connect the second auxiliary electrode 210 and the cathode electrode 250 with each other. As described above, the organic emitting layer 240 may be manufactured for the deposition process without using the mask for covering the upper surface of the second auxiliary electrode 210. In this case, the organic emitting layer 240 may be provided on the upper surface of the partition 230.

The cathode electrode 250 is provided on the organic emitting layer 240. As the cathode electrode 250 is provided on a surface from which light is emitted, the cathode electrode 250 is formed of a transparent conductive material. Thus, a resistance of the cathode electrode 250 is increased since the cathode electrode 250 is formed of the transparent conductive material. In order to lower the resistance of the cathode electrode 250, the cathode electrode 250 is connected with the second auxiliary electrode 210. That is, the cathode electrode 250 is connected with the second auxiliary electrode 210 via the space between the partition 230 and the bank 220. The cathode electrode 250 may be manufactured by sputtering, that is, a deposition process with inferior straightness. Accordingly, the cathode electrode 250 may be deposited in the space between the partition 230 and the bank 220 for the deposition process of the cathode electrode 250.

An encapsulation layer for preventing a permeation of moisture may be additionally provided on the cathode electrode 250. The encapsulation layer may be formed of various materials generally known to those in the art. A color filter for each pixel may be additionally provided on the cathode electrode 250. In this case, white light may be emitted from the organic emitting layer 240.

In the pad area (PA) of the substrate 100, there are a gate insulating film 120, an insulating interlayer 140, a signal pad 300, and a passivation layer 165.

The gate insulating film 120 is provided on the substrate 100, and the insulating interlayer 140 is provided on the gate insulating film 120. The gate insulating film 120 and the insulating interlayer 140, which extend from the active area (AA), are formed on an entire surface of the pad area (PA).

The signal pad 300 is provided on the insulating interlayer 140. The signal pad 300 may be formed of the same material as that of the source electrode 150 and the drain electrode 160 of the aforementioned active area (AA). The signal pad 300 is exposed to the external via a fourth contact hole (CH4) provided in the passivation layer 165, and is connected with the external driver.

The signal pad 300 may include a lower signal pad 301, a central signal pad 302, and an upper signal pad 303.

The lower signal pad 301 is provided between the insulating interlayer 140 and the central signal pad 302, wherein the lower signal pad 301 enhances an adhesive strength between the insulating interlayer 140 and the central signal pad 302. Also, the lower signal pad 301 prevents a lower surface of the central signal pad 302 from being corroded. Thus, an oxidation degree of the lower signal pad 301 may be lower than an oxidation degree of the central signal pad 302. That is, a corrosion resistance in a material of the lower signal pad 301 may be superior to a corrosion resistance in a material of the central signal pad 302. The lower signal pad 301 may be formed of the same material as that of the aforementioned lower source electrode 151 or lower drain electrode 161, that is, alloy (MoTi) of molybdenum and titanium, but is not limited to this material.

The central signal pad 302 is provided between the lower signal pad 301 and the upper signal pad 303. The central signal pad 302 may be formed of a low-resistance metal material such as copper (Cu), but is not limited to this metal material. The central signal pad 302 may be formed of a metal material whose resistance is relatively lower than that of the lower signal pad 301 and the upper signal pad 303. In order to lower a total resistance of the signal pad 300, a thickness of the central signal pad 302 is larger than a thickness of each of the lower signal pad 301 and the upper signal pad 303, preferably.

The upper signal pad 303 is provided on an upper surface of the central signal pad 302, to thereby prevent the upper surface of the central signal pad 302 from being corroded. Thus, an oxidation degree of the upper signal pad 303 may be lower than an oxidation degree of the central signal pad 302. That is, a corrosion resistance in a material of the upper signal pad 303 may be superior to a corrosion resistance in a material of the central signal pad 302. The upper signal pad 303 may be formed of a transparent conductive material such as indium-tin-oxide (ITO), but is not limited to this material.

According to one embodiment of the present invention, it is possible to prevent the central signal pad, which is vulnerable to corrosion, from being corroded. That is, the lower signal pad 301 prevents the lower surface of the central signal pad 302 from being corroded, the upper signal pad 303 prevents the upper surface of the central signal pad 302 from being corroded, and the passivation layer 165 prevents the lateral surface of the central signal pad 302 from being corroded. According to one embodiment of the present invention, the central signal pad 302, which is vulnerable to corrosion, is covered by the lower signal pad 301, the upper signal pad 303 and the passivation layer 165, so that it is possible to prevent the central signal pad 302 from being corroded.

Meanwhile, the upper signal pad 303 may be formed as the same material as that of the upper source electrode 153 and/or the upper drain electrode 163, and the upper signal pad 303 may be formed in the same thickness as that of the upper source electrode 153 and/or the upper drain electrode 163. The central signal pad 302 may be formed as the same material as that of the central source electrode 152 and/or the central drain electrode 162, and the central signal pad 302 may be formed in the same thickness as that of the central source electrode 152 and/or the central drain electrode 162. The lower signal pad 301 may be formed as the same material as that of the lower source electrode 151 and/or the lower drain electrode 161, and the lower signal pad 301 may be formed in the same thickness as that of the lower source electrode 151 and/or the lower drain electrode 161. In this case, the signal pad 300 and the source electrode 150 and/or the drain electrode 160 may be simultaneously manufactured in the same process.

The passivation layer 165 is provided on the signal pad 300. The passivation layer 165 extends from the active area (AA). The fourth contact hole (CH4) for exposing a predetermined part of the signal pad 300 is provided in the passivation layer 165. Especially, the passivation layer 165 covers the lateral surface of the signal pad 300, and more particularly, the lateral surface of the central signal pad 302 which is vulnerable to corrosion, to thereby prevent the corrosion in the lateral surface of the signal pad 300.

Figure 3:
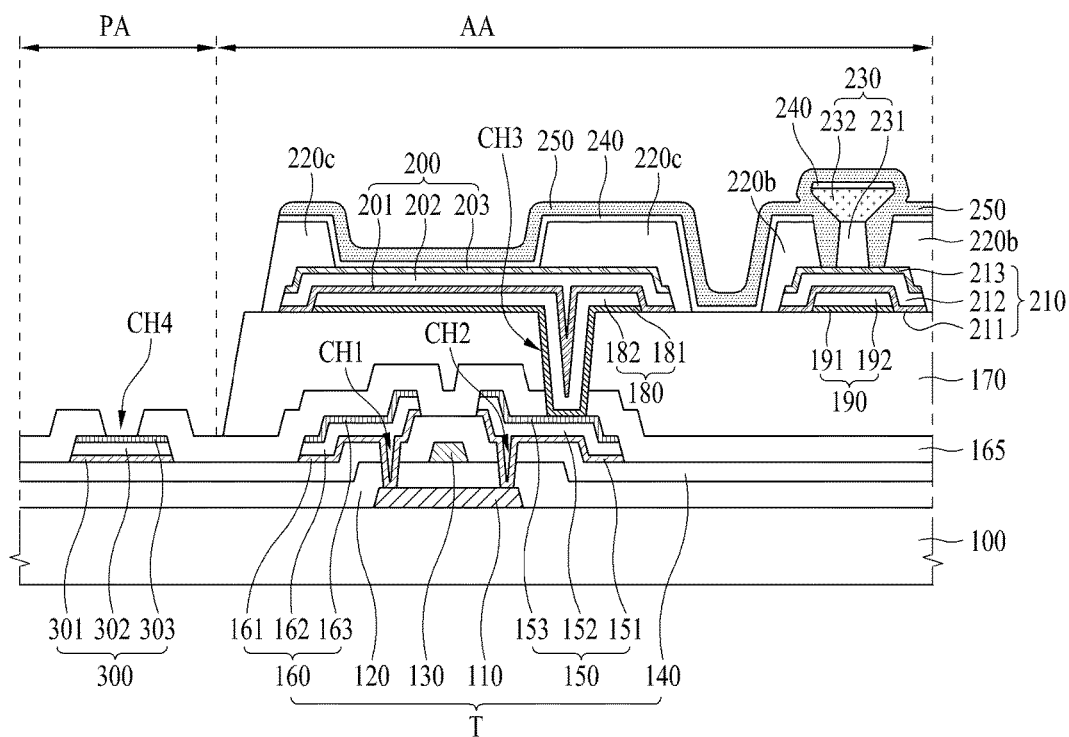
FIG. 3 is a cross sectional view illustrating an organic light emitting display device according to another embodiment of the present invention.

FIG. 3 is a cross sectional view illustrating an organic light emitting display device according to another embodiment of the present invention. Except for the structures of banks 220b and 220c, organic emitting layer 240 and cathode electrode 250, the organic light emitting display device shown in FIG. 3 is the same as (or substantially the same as) the organic light emitting display device shown in FIG. 2. Thus, the same (or similar) reference numbers will be used throughout the drawings to refer to the same or like parts, and only different structures may be described in detail.

As shown in FIG. 3, the banks 220b and 220c are provided on a second anode electrode 200 and a second auxiliary electrode 210.

The banks 220b and 220c include the first bank 220b and the second banks 220c. The first bank 220b covers one side and the other side of the second auxiliary electrode 210, and the second bank 220c covers one side and the other side of the second anode electrode 200. The first bank 220b and the second bank 220c are spaced apart from each other, and a planarization layer 170 is exposed to the space between the first bank 220b and the second bank 220c.

The second bank 220c, which exposes a predetermined portion of an upper surface of the second anode electrode 200, covers one side and the other side of the second anode electrode 200. According as the second bank 220c is provided to expose the predetermined portion of the upper surface of the second anode electrode 200, it is possible to secure an image-displaying area. Also, the second bank 220c is provided to cover one side and the other side of the second anode electrode 200 so that it is possible to prevent a lateral surface of a second central anode electrode 202 from being exposed to the external, wherein the lateral surface of the second central anode electrode 202 is relatively vulnerable to corrosion, thereby preventing the lateral surface of the second central anode electrode 202 from being corroded.

Also, the second bank 220c is overlapped with a third contact hole (CH3) provided in the passivation layer 165 and the planarization layer 170. In this case, the second bank 220c prevents moisture from being permeated into the inside of the organic emitting layer 240 through the third contact hole (CH3). Meanwhile, in the aforementioned embodiment shown in FIG. 2, the bank 220 may be overlapped with the third contact hole (CH3).

The first bank 220b, which exposes a predetermined portion of an upper surface of the second auxiliary electrode 210, covers one side and the other side of the second auxiliary electrode 210. According as the first bank 220b is provided to expose the predetermined portion of the upper surface of the second auxiliary electrode 210, it is possible to secure an electrical connection space between the second auxiliary electrode 210 and the cathode electrode 250. Also, the first bank 220b is provided to cover one side and the other side of the second auxiliary electrode 210 so that it is possible to prevent a lateral surface of a second central auxiliary electrode 212 from being exposed to the external, wherein the lateral surface of the second central auxiliary electrode 212 is relatively vulnerable to corrosion, thereby preventing the lateral surface of the second central auxiliary electrode 212 from being corroded.

The first bank 220b and the second bank 220c are spaced apart from each other, and the planarization layer 170 is exposed through the space between the first bank 220b and the second bank 220c. Thus, the organic emitting layer 240 is provided directly on the upper surface of the planarization layer 170 in the space between the first bank 220b and the second bank 220c. Also, the cathode electrode 250 is provided on the upper surface of the organic emitting layer 240 in the space between the first bank 220b and the second bank 220c.

FIGS. 4A to 4J are cross sectional views illustrating a method of manufacturing the organic light emitting display device according to one embodiment of the present invention, which shows the method of manufacturing the organic light emitting display device shown in FIG. 2. Thus, the same (or similar) reference numbers will be used throughout the drawings to refer to the same or like parts, and a repetitive description for the material and structure of each structure may be omitted or brief.

Figure 4A:
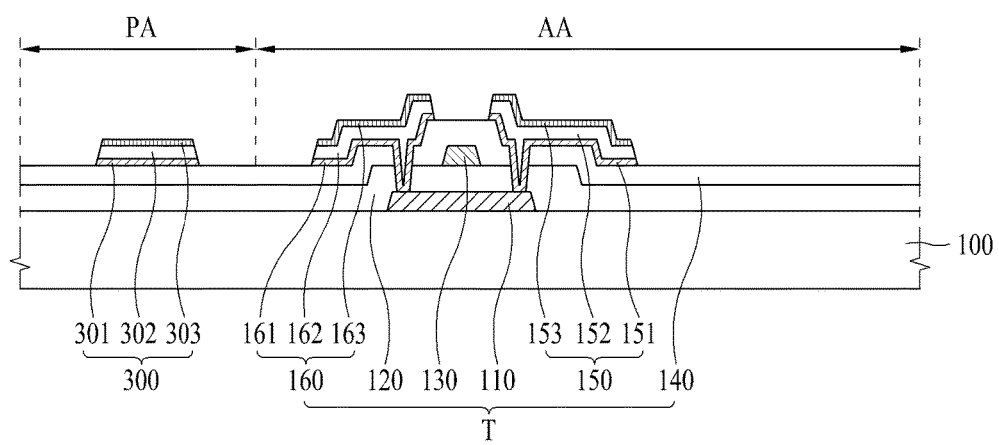
FIGS. 4A to 4J are cross sectional views illustrating a method of manufacturing the organic light emitting display device according to one embodiment of the present invention.

First, as shown in FIG. 4A, the active layer 110, the gate insulating film 120, the gate electrode 130, the insulating interlayer 140, the source electrode 150, the drain electrode 160 and the signal pad 300 are sequentially provided on the substrate 100.

In more detail, the active layer 110 is provided on the substrate 100, the gate insulating film 120 is provided on the active layer 110, the gate electrode 130 is provided on the gate insulating film 120, the insulating interlayer 140 is provided on the gate electrode 130, the first and second contact holes (CH1, CH2) are provided in the gate insulating film 120 and the insulating interlayer 140, the drain electrode 160 connected with one end of the active layer 110 via the first contact hole (CH1) is provided and the source electrode 150 connected with the other end of the active layer 110 via the second contact hole (CH2) is provided, and the signal pad 300 is provided.

In this case, the active layer 110, the gate electrode 130, the source electrode 150 and the drain electrode 160 are provided in the active area (AA), the gate insulating film 120 and the insulating interlayer 140 extend from the active area (AA) to the pad area (PA), and the signal pad 330 is provided in the pad area (PA). By the aforementioned manufacturing process, the thin film transistor layer (T) is formed in the active area (AA), and the signal pad 300 is formed in the pad area (PA).

The source electrode 150 may include the lower source electrode 151, the central source electrode 152, and the upper source electrode 153. The drain electrode 160 may include the lower drain electrode 161, the central drain electrode 162 and the upper drain electrode 163. The signal pad 300 may include the lower signal pad 301, the central signal pad 302 and the upper signal pad 303. The source electrode 150, the drain electrode 160 and the signal pad 300 may be formed of the same material, and may be simultaneously manufactured in the same patterning process.

Figure 4B:
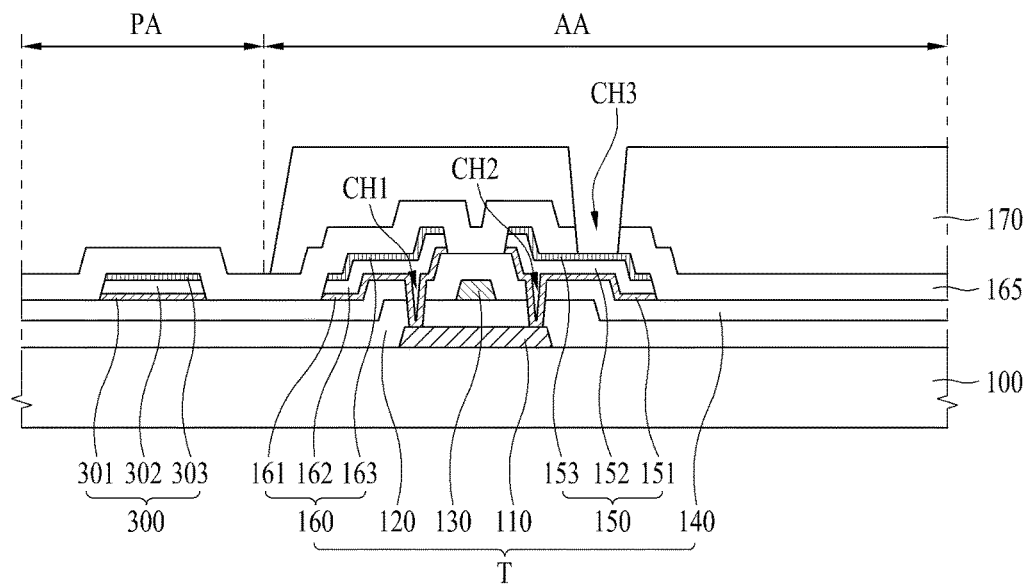

Then, as shown in FIG. 4B, the passivation layer 165 is provided on the source electrode 150, the drain electrode 160 and the signal pad 300. The planarization layer 170 is provided on the passivation layer 165. The third contact hole (CH3) is formed in the passivation layer 165 and the planarization layer 170, whereby the source electrode 150 is exposed via the third contact hole (CH3).

The passivation layer 165 extends from the active area (AA) to the pad area (PA), and the planarization layer 170 is provided in the active area (AA). The thin film transistor is not formed in the pad area (PA), that is, it is unnecessary to planarize the surface of the pad area (PA). Accordingly, the planarization layer 170 is not provided in the pad area (PA).

The passivation layer 165, the planarization layer 170 and the third contact hole (CH3) may be manufactured by one mask process using a half-tone mask.

According to one embodiment of the present invention, the signal pad 300 is not exposed to the external for the process of forming the third contact hole (CH3) to expose the source electrode 150 to the external. In order to connect the signal pad 300 with the external driver, it is necessary to remove the area of the passivation layer 165 which covers the upper surface of the signal pad 300. Herein, the process of removing the area of the passivation layer 165 which covers the upper surface of the signal pad 300 and the process of forming the third contact hole (CH3) may be carried out at the same time. However, if the process of removing the area of the passivation layer 165 which covers the upper surface of the signal pad 300 and the process of forming the third contact hole (CH3) are carried out at the same time, the signal pad 300 may be damaged by an etchant used for patterning the first anode electrode 180 and the first auxiliary electrode 190 to be explained with reference to FIG. 4C. Thus, in order to prevent the signal pad 300 from being damaged by the etchant, the signal pad 300 is not exposed to the external for the process of forming the third contact hole (CH3).

Figure 4C:
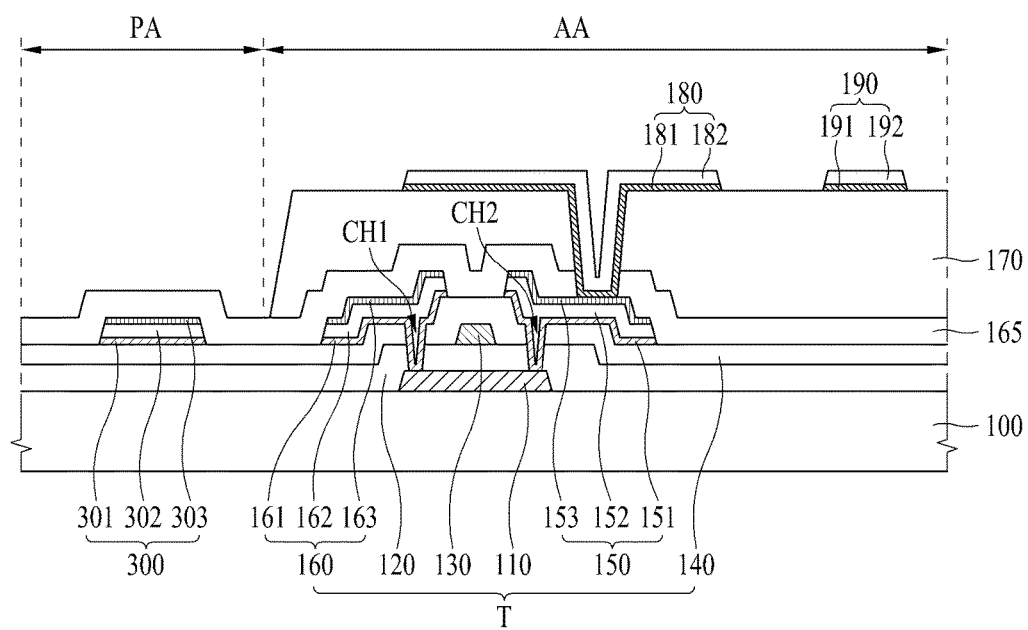

Then, as shown in FIG. 4C, the first anode electrode 180 and the first auxiliary electrode 190 are provided on the planarization layer 170 of the active area (AA), wherein the first anode electrode 180 and the first auxiliary electrode 190 are spaced apart from each other.

The first anode electrode 180 is connected with the source electrode 150 via the third contact hole (CH3). The third contact hole (CH3) may be provided to expose the drain electrode 160. In this case, the drain electrode 160 and the first anode electrode 180 may be connected with each other via the third contact hole (CH3).

The first anode electrode 180 may include the first lower anode electrode 181 and the first upper anode electrode 182, and the first auxiliary electrode 190 may include the first lower auxiliary electrode 191 and the first upper auxiliary electrode 192.

The first anode electrode 180 and the first auxiliary electrode 190 may be formed of the same material, and may be simultaneously manufactured in the same patterning process.

Figure 4D:
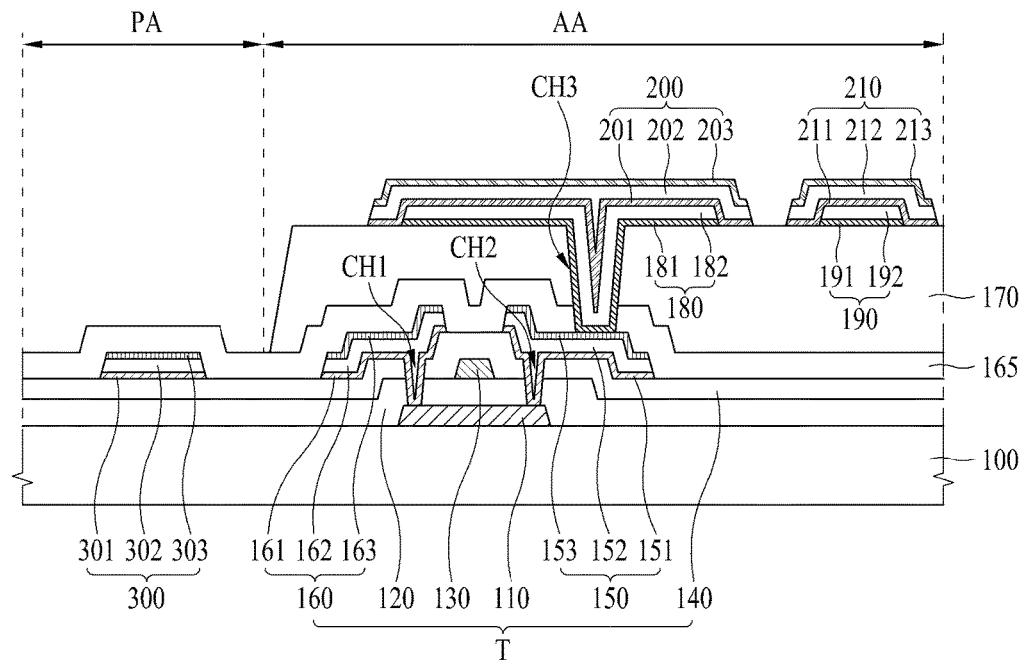

Then, as shown in FIG. 4D, the second anode electrode 200 is provided on the first anode electrode 180 of the active area (AA), and the second auxiliary electrode 210 is provided on the first auxiliary electrode 190 of the active area (AA).

The second anode electrode 200 is patterned to cover the upper and lateral surfaces of the first anode electrode 180, and the second auxiliary electrode 210 is patterned to cover the upper and lateral surfaces of the first auxiliary electrode 190. The second anode electrode 200 and the second auxiliary electrode 210 may be formed of the same material, and may be simultaneously manufactured in the same patterning process.

The second anode electrode 200 may include the second lower anode electrode 201, the second central anode electrode 202, and the second upper anode electrode 203, and the second auxiliary electrode 210 may include the second lower auxiliary electrode 211, the second central auxiliary electrode 212, and the second upper auxiliary electrode 213.

Figure 4E:
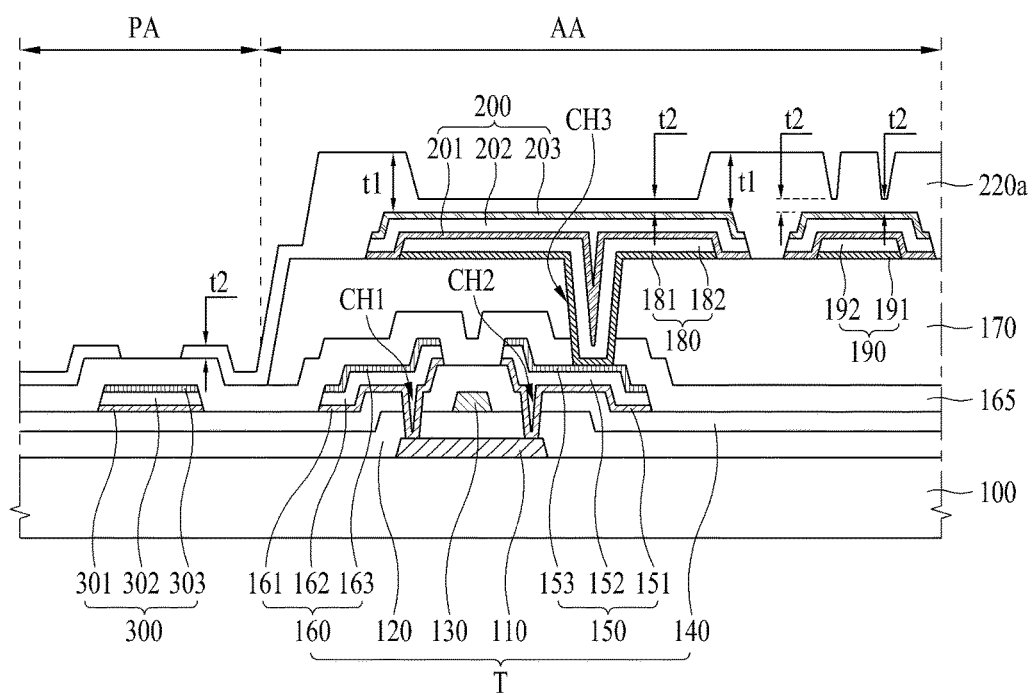

Then, as shown in FIG. 4E, a photoresist pattern 220a is formed in the active area (AA) and the pad area (PA).

The photoresist pattern 220a is provided on the second anode electrode 200, the second auxiliary electrode 210, the planarization layer 170 and the passivation layer 165.

The photoresist pattern 220a includes an area having a first thickness (t1) of a relatively large thickness, and an area having a second thickness (t2) of a relatively small thickness. The area having the first thickness (t1) corresponds to a lateral side area of the second anode electrode 200, and also corresponds to a lateral side area of the second auxiliary electrode 210, and a predetermined portion of a central area of the second auxiliary electrode 210. The area having the second thickness (t2) corresponds to an area between each area having the first thickness (t1). In detail, the area having the second thickness (t2) corresponds to a central area of the second anode electrode 200, also corresponds to an area between each area having the first thickness (t1) in the central area of the second auxiliary electrode 210. Also, the area having the second thickness (t2) corresponds to the pad area. At least one portion of the photoresist pattern 220a is not provided in an area overlapped with the signal pad 300.

The photoresist pattern 220a includes the area having the first thickness (t1) and the area having the second thickness (t2), and the photoresist pattern 220a is not provided in the area overlapped with the signal pad 300. The photoresist pattern 220a may be obtained by a half-tone mask process.

Figure 4F:
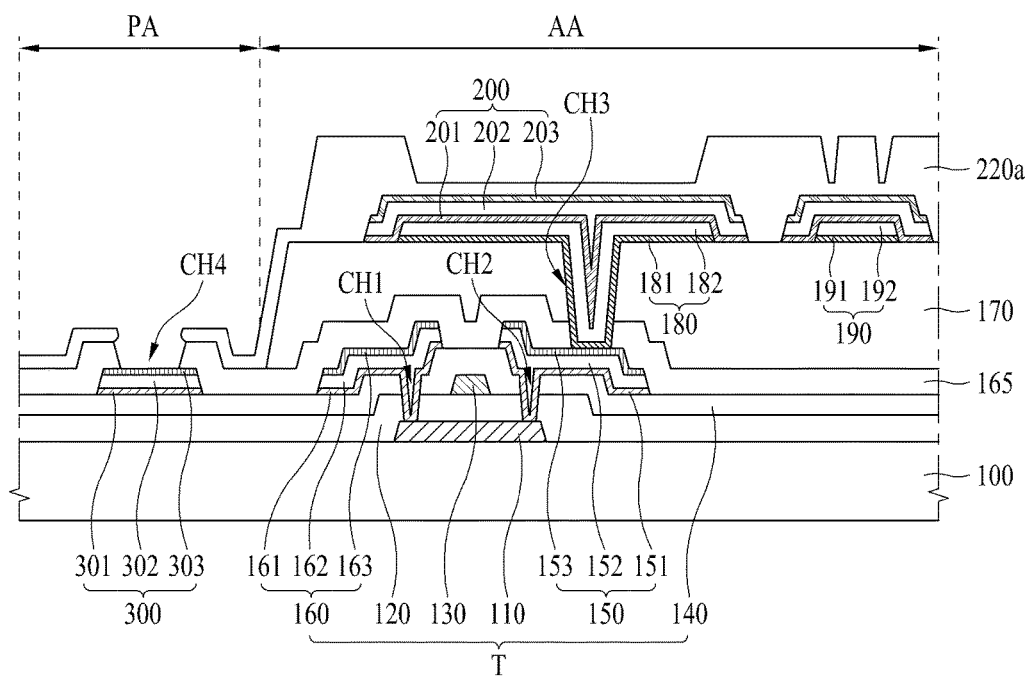

Then, as shown in FIG. 4F, the fourth contact hole (CH4) is formed by removing the area of the passivation layer 165 for covering the upper surface of the signal pad 300 under the condition that the photoresist pattern 220a is used as a mask. That is, the fourth contact hole (CH4) is provided in the passivation layer 165, whereby the signal pad 300 is exposed to the external through the fourth contact hole (CH4). The signal pad 300 may be connected with the external driver via the fourth contact hole (CH4).

Figure 4G:
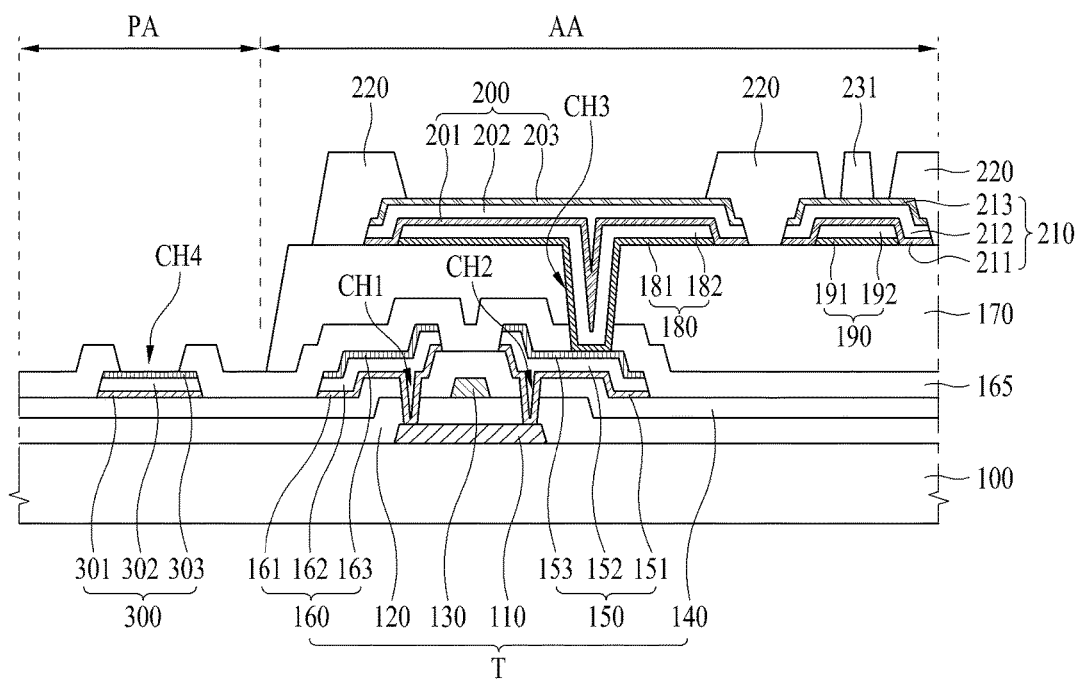

Then, as shown in FIG. 4G, the bank 220 and the first partition 231 are formed by ashing the photoresist pattern 220a.

By ashing the photoresist pattern 220a, the area having the second thickness (t2) of the relatively small thickness is removed, and the area having the first thickness (t1) of the relatively large thickness remains, whereby the bank 220 and the first partition 231 are formed by the remaining photoresist pattern 220a.

In more detail, the photoresist pattern 220a is removed from the area having the second thickness (t2) of the relatively small thickness, to thereby expose the upper surface of the second anode electrode 200, the predetermined portion of the upper surface of the second auxiliary electrode 210, and the upper surface of the passivation layer 165. Also, the photoresist pattern 220a remains in the area having the first thickness (t1) of the relatively large thickness, whereby the bank 220 is formed on one side and the other side of the second anode electrode 200, the bank 220 is formed on one side and the other side of the second auxiliary electrode 210, and the first partition 231 is formed on the upper surface of the second auxiliary electrode 210. The first partition 231 is provided at a predetermined distance from the bank 220.

According to one embodiment of the present invention, the fourth contact hole (CH4) for exposing the signal pad 300 to the external is formed with the photoresist pattern 220a used as the mask, and the bank 220 and the first partition 231 are formed with the photoresist pattern 220a remaining after the ashing treatment. According to one embodiment of the present invention, the fourth contact hole (CH4), the bank 220 and the first partition 231 may be formed by one mask process so that it is possible to reduce the mask process.

Figure 4H:
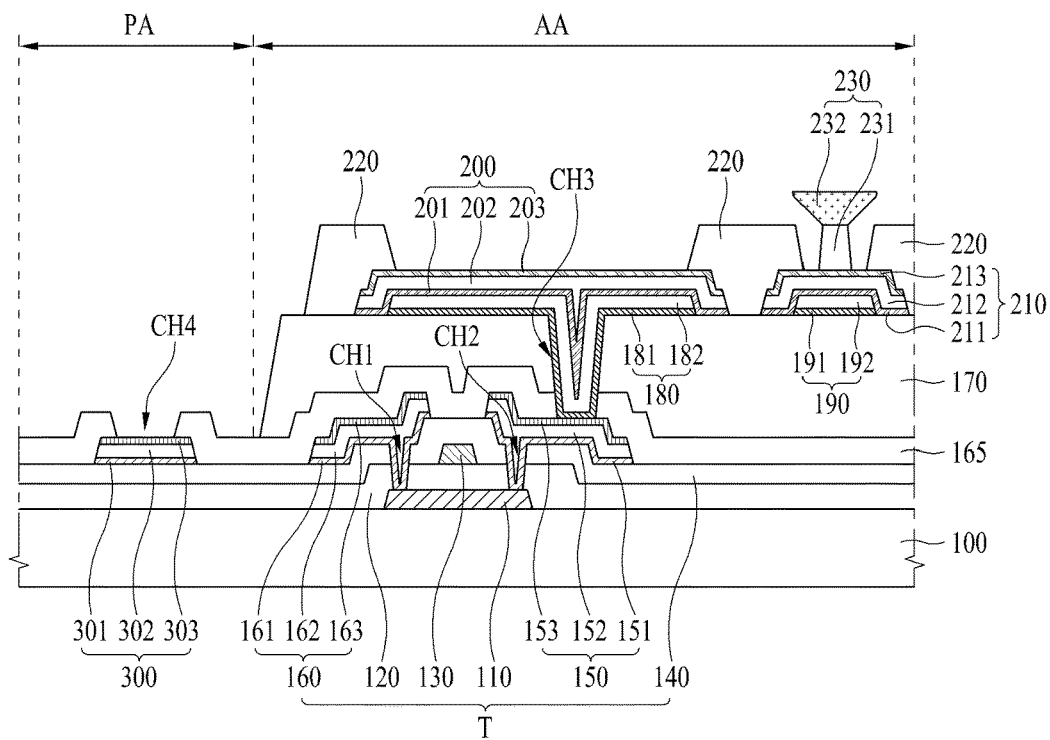

As shown in FIG. 4H, the second partition 232 is provided on the first partition 231, to thereby form the partition 230 including the first partition 231 and the second partition 232.

The partition 230 is provided at the predetermined distance from the bank 220, whereby the space is prepared between the partition 230 and the bank 220.

In order to provide the partition 230 whose upper surface serves as the eaves, the width in the upper surface of the second partition 232 is larger than the width in the lower surface of the second partition 232. Especially, from a front view, the space between the partition 230 and the bank 220 is covered by the upper surface of the second partition 232 so that it is possible to prevent the organic emitting layer 240 from being deposited in the space between the partition 230 and the bank 220 for the deposition process of the organic emitting layer 240.

Figure 4I:
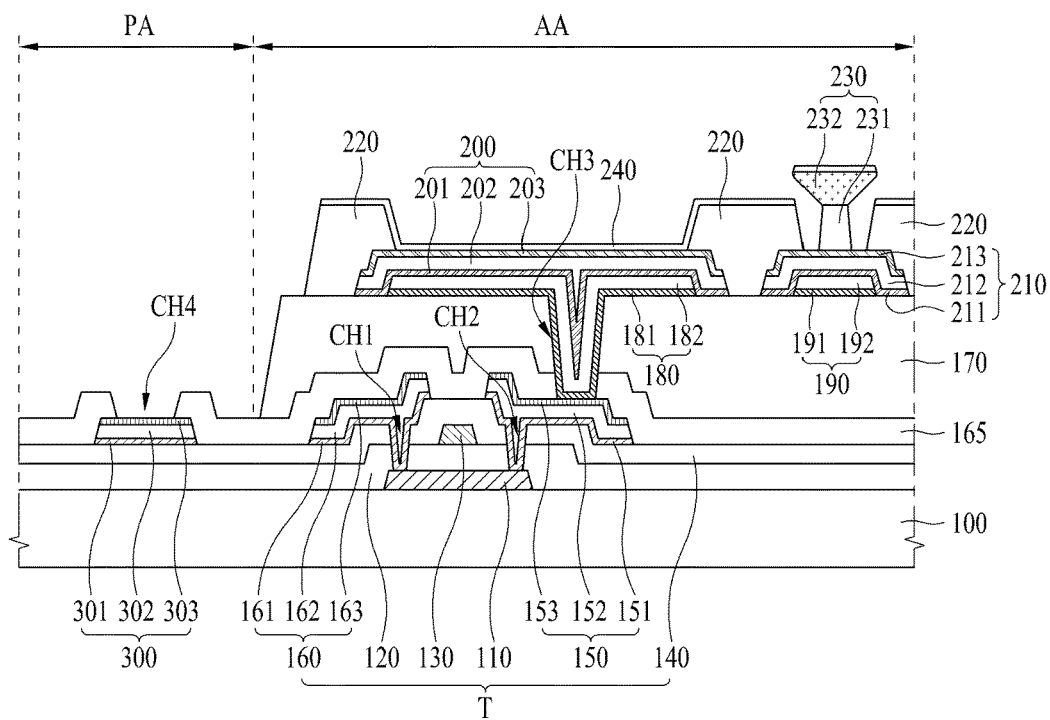

As shown in FIG. 4I, the organic emitting layer 240 is provided on the second anode electrode 200. The organic emitting layer 240 may be manufactured by an evaporation method using a deposition material with superior straightness. Thus, the organic emitting layer 240 is deposited on the upper surface of the bank 220 and the partition 230, however, the organic emitting layer 240 is not deposited in the space between the bank 220 and the partition 230. That is, the upper surface of the partition 230 serves as the eaves for the deposition process of the organic emitting layer 240, whereby it is possible to prevent the organic emitting layer 240 from being deposited in the space between the partition 230 and the bank 220 for the deposition process of the organic emitting layer 240 without using the mask pattern of covering the upper surface of the second auxiliary electrode 210.

Figure 4J:
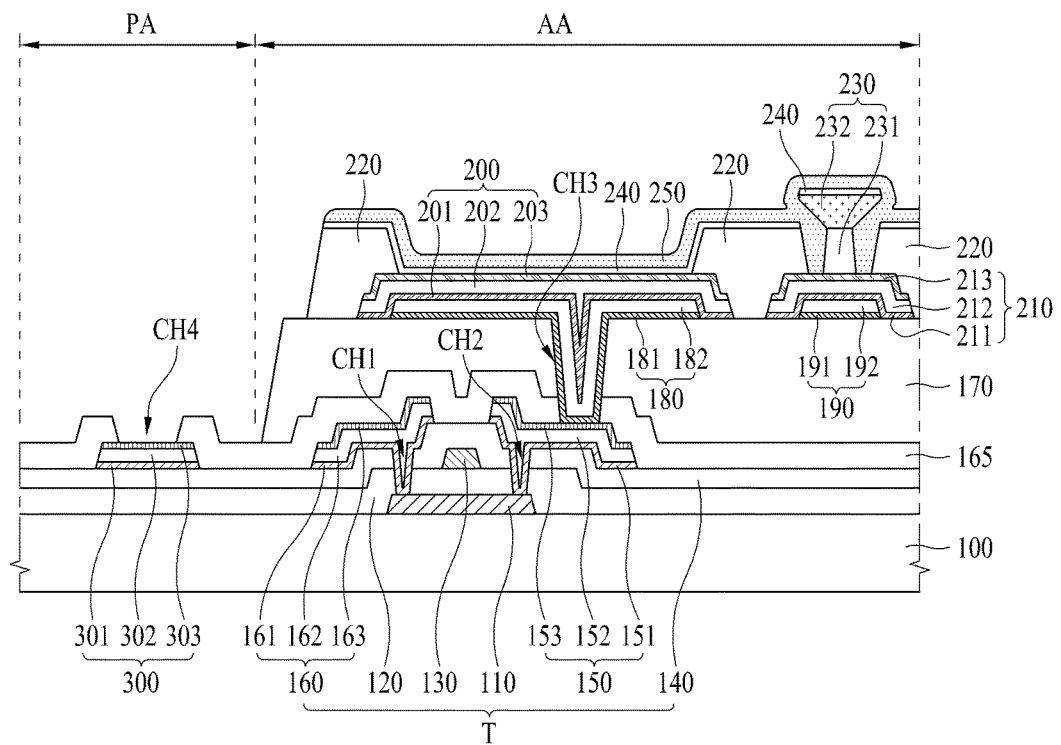

Then, as shown in FIG. 4J, the cathode electrode 250 is provided on the organic emitting layer 240.

The cathode electrode 250 is connected with the second auxiliary electrode 210 via the space between the partition 230 and the bank 220. The cathode electrode 250 may be manufactured by sputtering, that is, a deposition process with inferior straightness. Accordingly, the cathode electrode 250 may be deposited in the space between the partition 230 and the bank 220 for the deposition process of the cathode electrode 250.

FIGS. 5A to 5K are cross sectional views illustrating a method of manufacturing the organic light emitting display device according to another embodiment of the present invention, which shows the method of manufacturing the organic light emitting display device shown in FIG. 3.

Figure 5A:
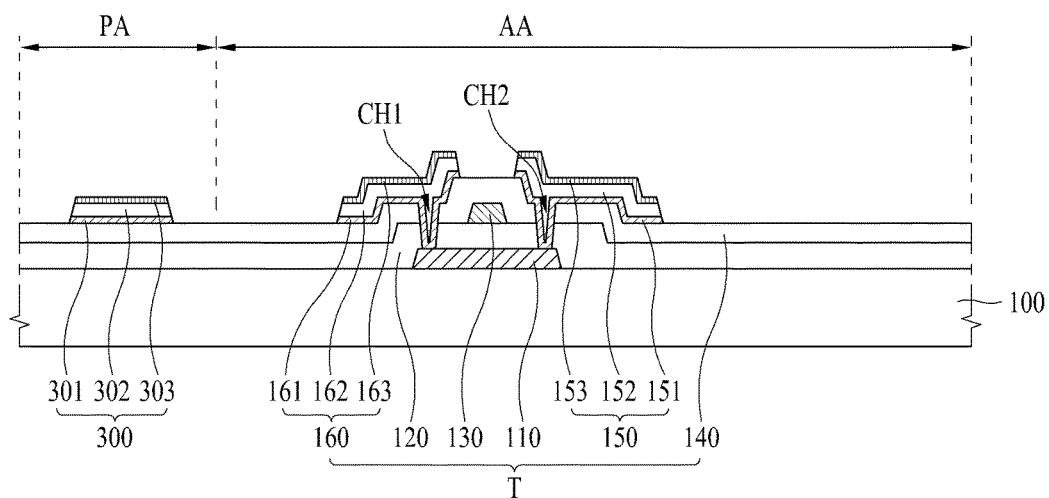
FIGS. 5A to 5K are cross sectional views illustrating a method of manufacturing the organic light emitting display device according to another embodiment of the present invention.

First, as shown in FIG. 5A, the active layer 110, the gate insulating film 120, the gate electrode 130, the insulating interlayer 140, the source electrode 150, the drain electrode 160 and the signal pad 300 are sequentially provided on the substrate 100.

This process is the same as the aforementioned process of FIG. 4A, whereby a detailed description for this process will be omitted.

Figure 5B:
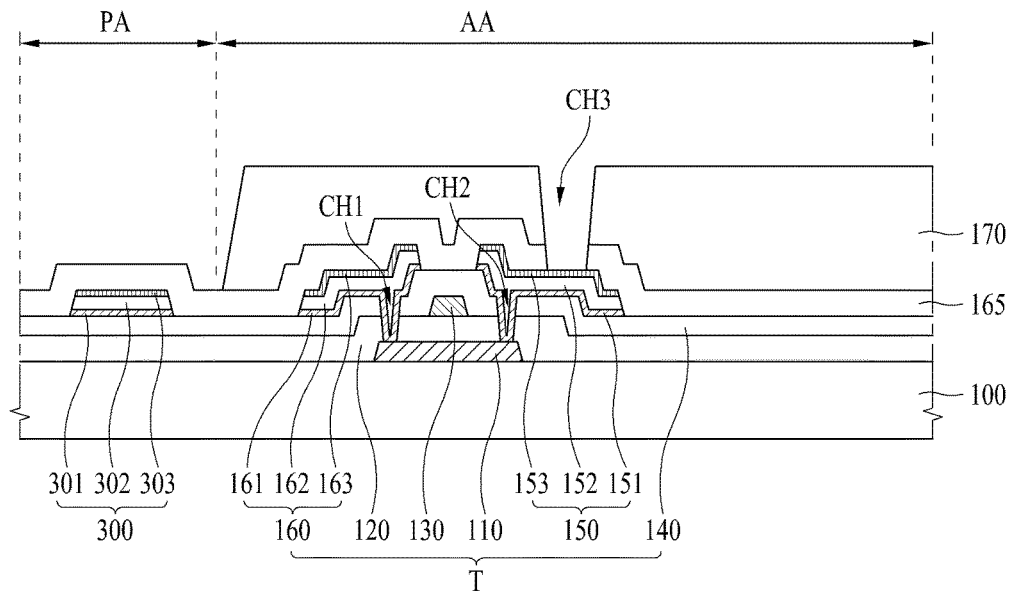

Then, as shown in FIG. 5B, the passivation layer 165 is provided on the source electrode 150, the drain electrode 160 and the signal pad 300. The planarization layer 170 is provided on the passivation layer 165. The third contact hole (CH3) is formed in the passivation layer 165 and the planarization layer 170, whereby the source electrode 150 is exposed via the third contact hole (CH3). If needed, the drain electrode 160 may be exposed via the third contact hole (CH3).

This process is the same as the aforementioned process of FIG. 4B, whereby a detailed description for this process will be omitted.

Figure 5C:
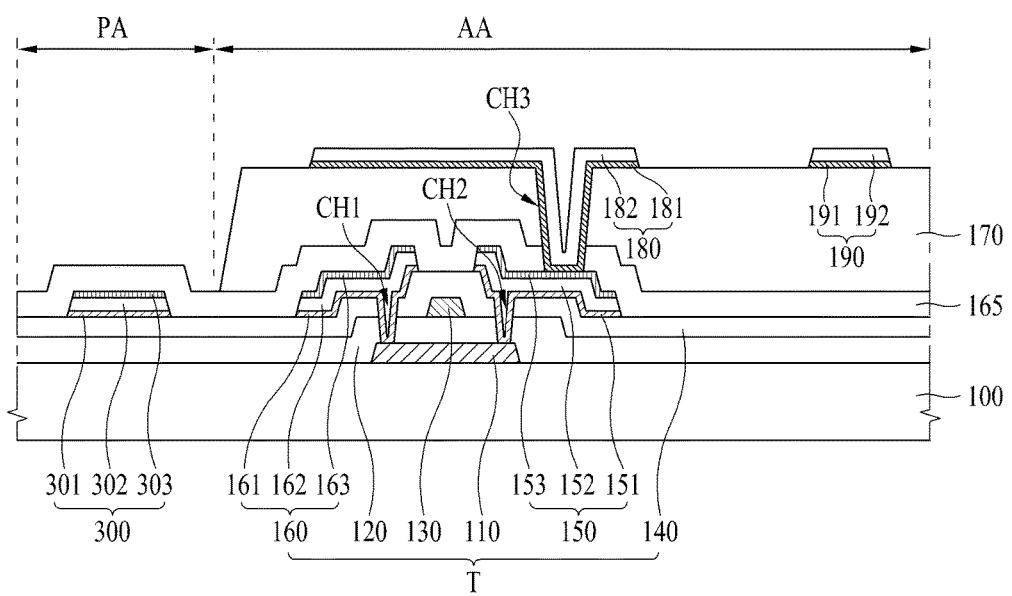

Then, as shown in FIG. 5C, the first anode electrode 180 and the first auxiliary electrode 190 are provided on the planarization layer 170 of the active area (AA), wherein the first anode electrode 180 is spaced apart from the first auxiliary electrode 190.

This process is the same as the aforementioned process of FIG. 4C, whereby a detailed description for this process will be omitted.

Figure 5D:
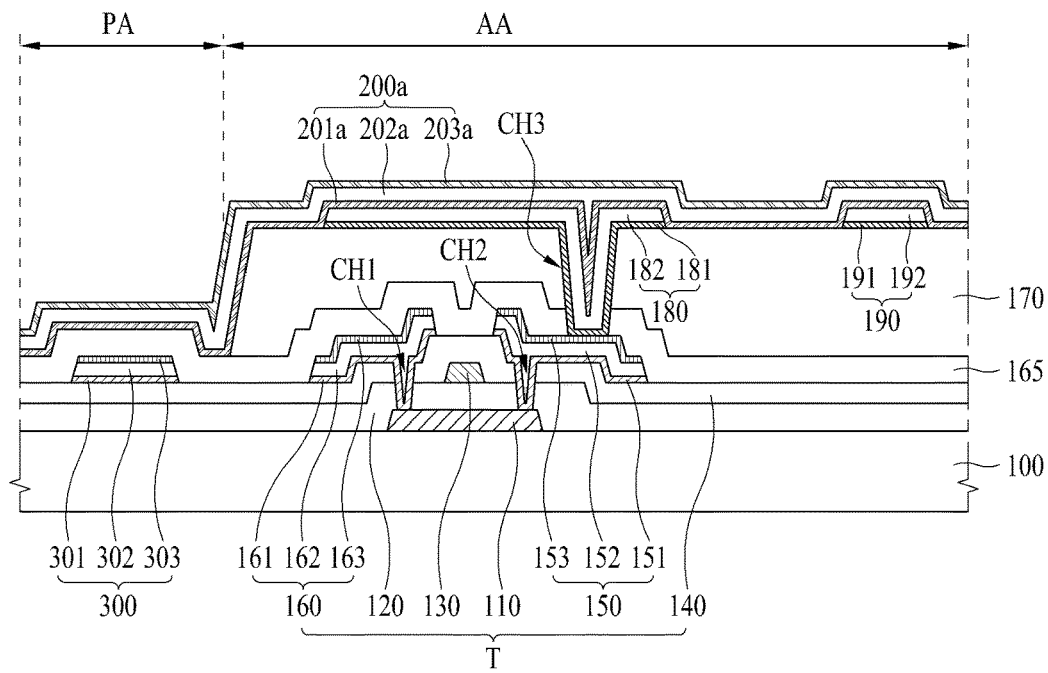

Then, as shown in FIG. 5D, a second electrode layer 200a is provided on an entire surface of the substrate 100. The second electrode layer 200a is provided on the upper surface of the passivation layer 165 of the pad area (PA), and also provided on the upper surfaces of the planarization layer 170, the first anode electrode 180 and the first auxiliary electrode 190 of the active area (AA).

The second electrode layer 200a may include a second lower electrode layer 201a, a second central electrode layer 202a, and a second upper electrode layer 203a. Through a patterning process, the second anode electrode 200 and the second auxiliary electrode 210 are formed by the second electrode layer 200a.

That is, the second lower anode electrode 201 and the second lower auxiliary electrode 211 are formed by the second lower electrode layer 201a, the second central anode electrode 202 and the second central auxiliary electrode 212 are formed by the second central electrode layer 202a, and the second upper anode electrode 203 and the second upper auxiliary electrode 213 are formed by the second upper electrode layer 203a.

Figure 5E:
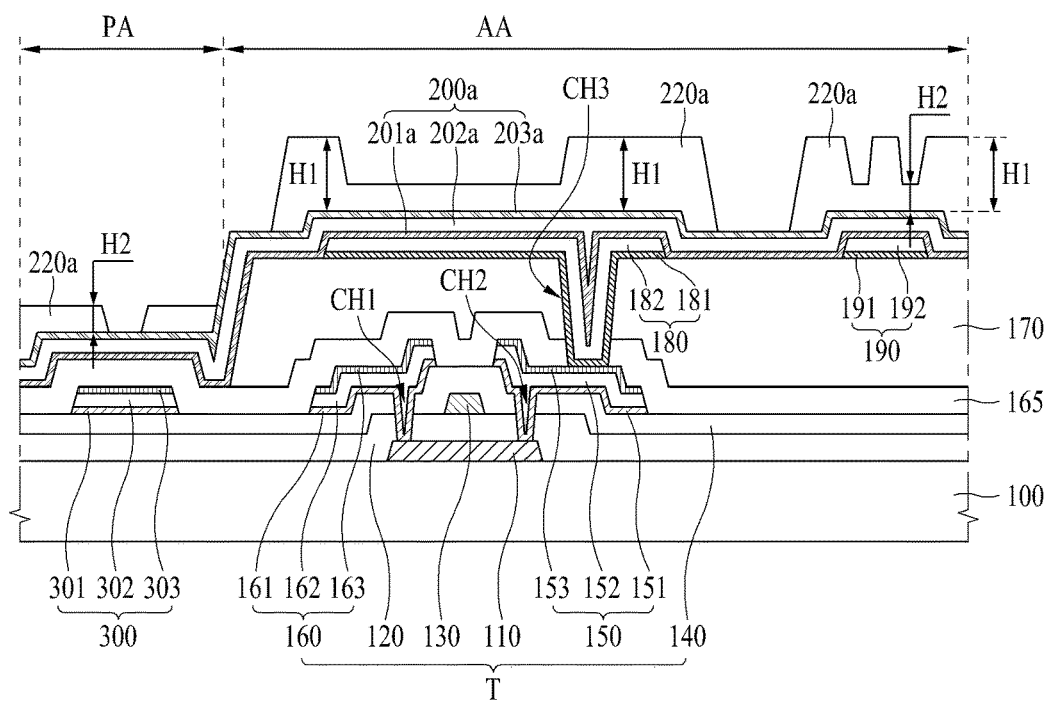

Then, as shown in FIG. 5E, a photoresist pattern 220a is provided on the second electrode layer 200a of the active area (AA) and the pad area (PA).

The photoresist pattern 220a includes an area having a first thickness (H1) of a relatively large thickness, and an area having a second thickness (H2) of a relatively small thickness.

The area having the first thickness (H1) corresponds to a lateral side area of the first anode electrode 180, and also corresponds to a lateral side area of the first auxiliary electrode 190, and a predetermined portion of a central area of the first auxiliary electrode 190. The area having the second thickness (H2) corresponds to an area between each area having the first thickness (H1). In detail, the area having the second thickness (H2) corresponds to a central area of the first anode electrode 190, also corresponds to an area between each area having the first thickness (H1) in the central area of the first auxiliary electrode 190. Also, the area having the second thickness (H2) corresponds to the pad area.

Also, the photoresist pattern 220a is not provided in at least one portion of an area overlapped with the signal pad 300, and the photoresist pattern 220a is not provided in the boundary area between the active area (AA) and the pad area (PA). Also, the photoresist pattern 220a is not provided in the area between the first anode electrode 180 and the first auxiliary electrode 190.

The photoresist pattern 220a including the area having the first thickness (H1) and the area having the second thickness (H2) may be obtained by a half-tone mask process.

Figure 5F:
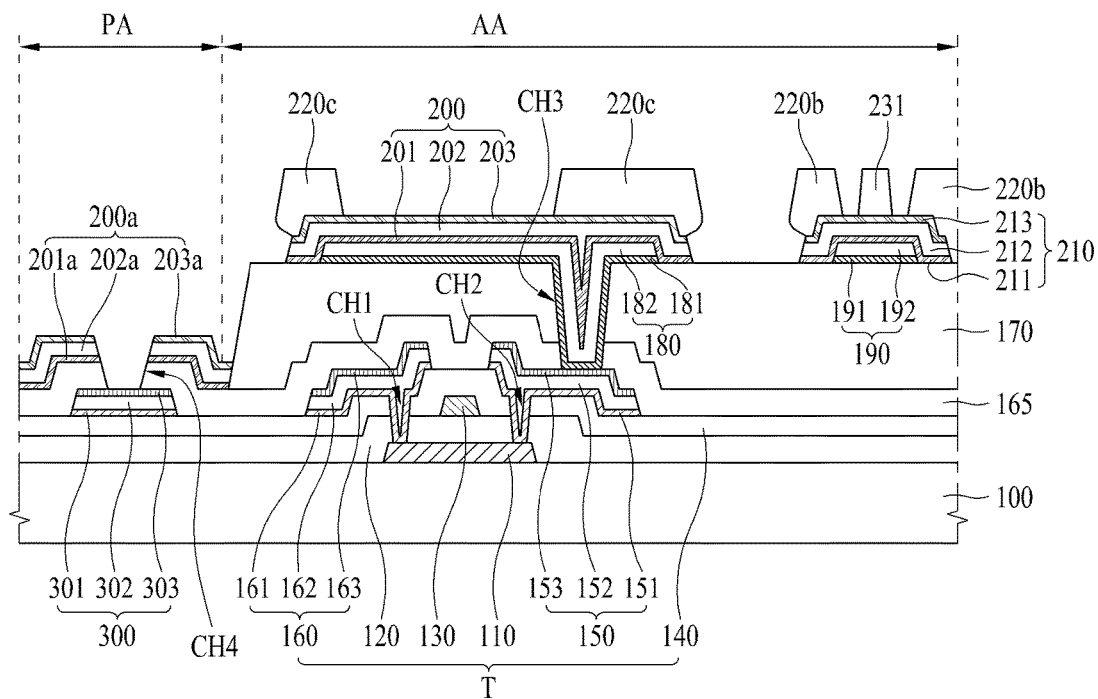

Then, as shown in FIG. 5F, the area of the second electrode layer 200a and the area of the passivation layer 165 are removed by using the photoresist pattern 220a as a mask.

In detail, the fourth contact hole (CH4) is formed by removing the area of the second electrode layer 200a and the area of the passivation layer 165 provided on the signal pad 300 under the condition the photoresist pattern 220a is used as the mask. That is, according as the fourth contact hole (CH4) is formed in the passivation layer 165, the signal pad 300 is exposed to the external via the fourth contact hole (CH4). The signal pad 300 may be connected with an external driver via the fourth contact hole (CH4).

Also, the second anode electrode 200 and the second auxiliary electrode 210 are formed by removing the area of the second electrode layer 200a in the boundary area between the active area (AA) and the pad area (PA) and removing the area of the second electrode layer 200a between the first anode electrode 180 and the first auxiliary electrode 190. That is, the second anode electrode 200 and the second auxiliary electrode 210 are formed by exposing the planarization layer 170 in the boundary area between the active area (AA) and the pad area (PA), and the planarization layer 170 between the first anode electrode 180 and the first auxiliary electrode 190.

After that, the ashing treatment is applied to the photoresist pattern 220a, whereby the photoresist pattern 220a is removed from the area having the second thickness (H2) of the relatively small thickness, and the photoresist pattern 220 remains in the area having the first thickness (H1) of the relatively large thickness. Thus, the first bank 220b, the second bank 220c and the first partition 231 are formed by the remaining photoresist pattern 220a.

According to another embodiment of the present invention, the second anode electrode 200 and the second auxiliary electrode 210 are patterned by using the photoresist pattern 220a as the mask, the fourth contact hole (CH4) for exposing the signal pad 300 to the external is formed by using the photoresist pattern 220a as the mask, and the first bank 220b, the second bank 220c and the first partition 231 are formed by the photoresist pattern 220a remaining after the ashing treatment. According to another embodiment of the present invention, the second anode electrode 200, the second auxiliary electrode 210, the fourth contact hole (CH4), the first bank 220b, the second bank 220c and the first partition 231 are manufactured by one mask process, to thereby reduce the mask process.

Figure 5G:
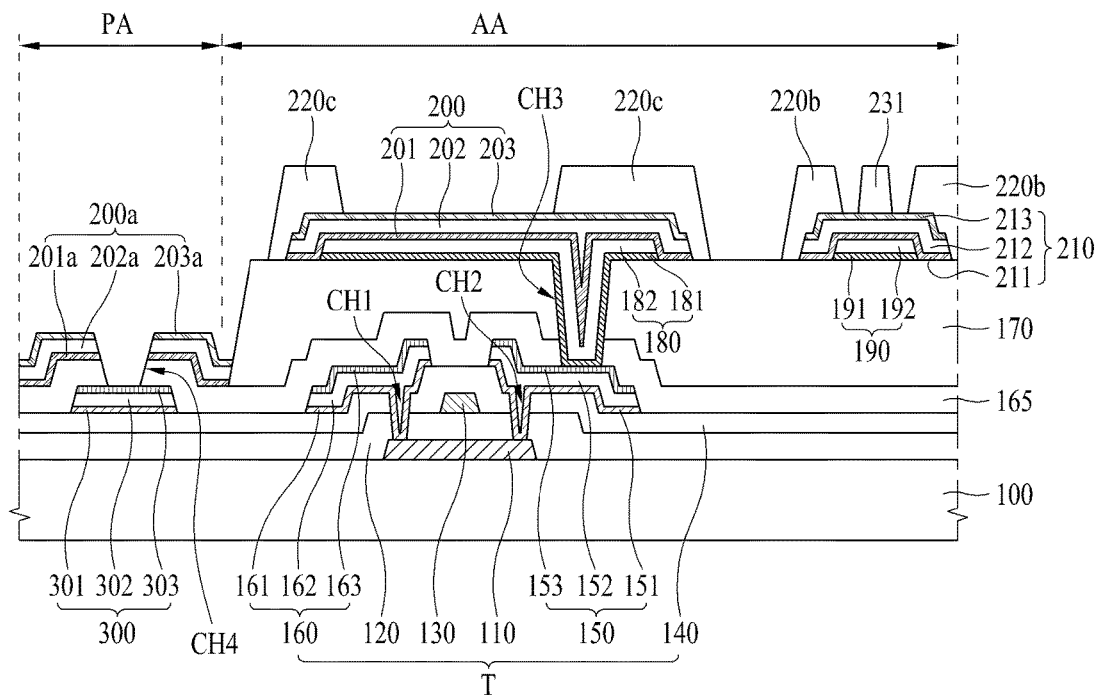

Then, as shown in FIG. 5G, a lower end of the bank 220b and 220c is connected with the planarization layer 170 by a thermal reflow process.

Referring to the aforementioned process of FIG. 5F, after the area of the second electrode layer 200a is etched, the bank 220b and 220c is formed by applying the ashing treatment to the photoresist pattern 220a. In this case, a lower end of the bank 220b and 220c is partially missing so that the bank 220b and 220c is not in contact with the planarization layer 170. Thus, the lateral sides of the second anode electrode 200 and the second auxiliary electrode 210 are exposed to the external. According as the lower end of the bank 220b and 220c is connected with the planarization layer 170 for the process of FIG. 5G, it is possible to cover the lateral sides of the second anode electrode 200 and the second auxiliary electrode 210.

The thermal reflow process indicates a process of deforming a structure by a high temperature. According as the lateral side of the bank 220b and 220c is melt by the high temperature, a link of polymer for the bank 220b and 220c is partially broken, whereby the melted lateral side of the bank 220b and 220c is shrunk and then connected with the planarization layer 170.

Figure 5H:
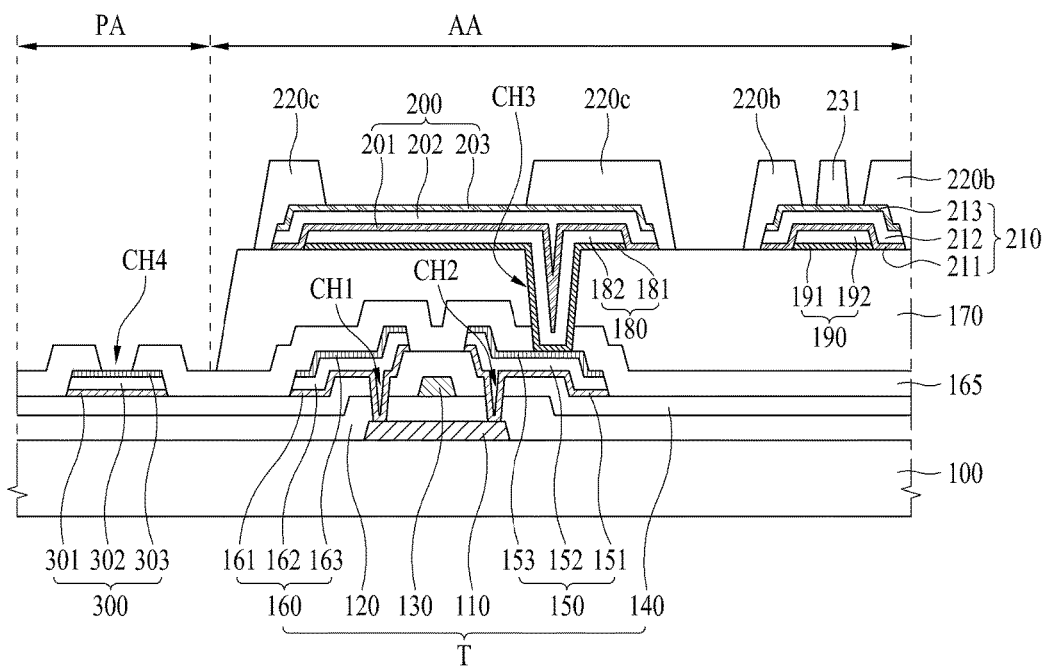

Then, as shown in FIG. 5H, the remaining second electrode layer 200a is removed from the pad area (PA). The process of removing the remaining second electrode layer 200a from the pad area (PA) may be carried out by a laser irradiation process.

Figure 5I:
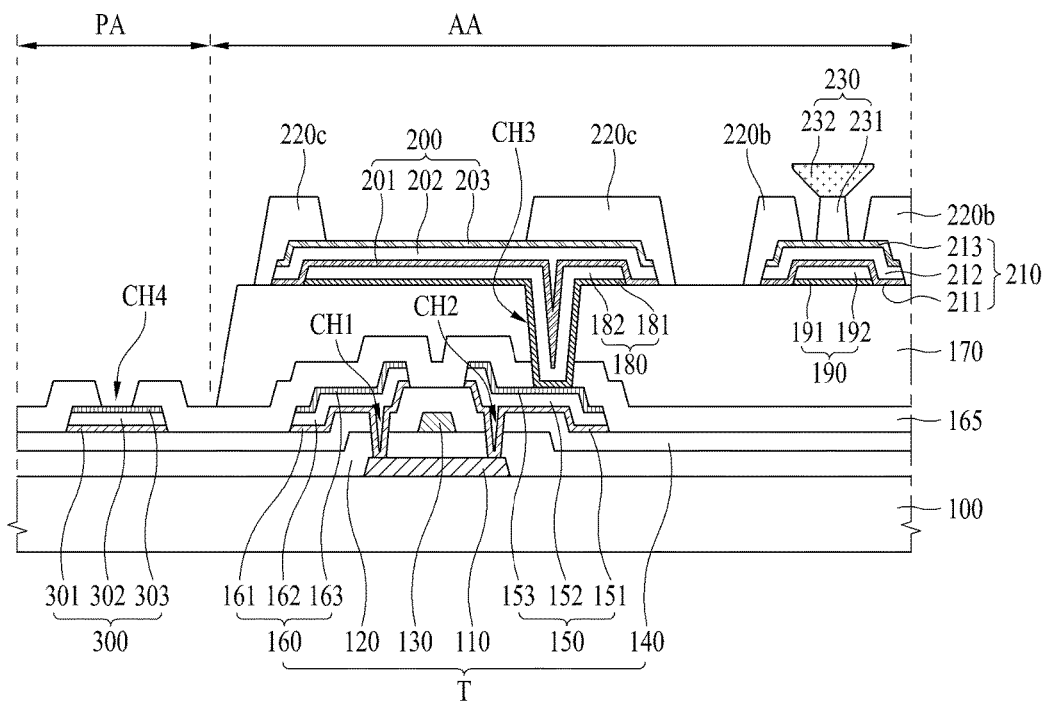

Then, as shown in FIG. 5I, the second partition 232 is provided on the first partition 231, to thereby form the partition 230 including the first partition 231 and the second partition 232.

This process is the same as the aforementioned process of FIG. 4H, whereby a detailed description for this process will be omitted.

Figure 5J:
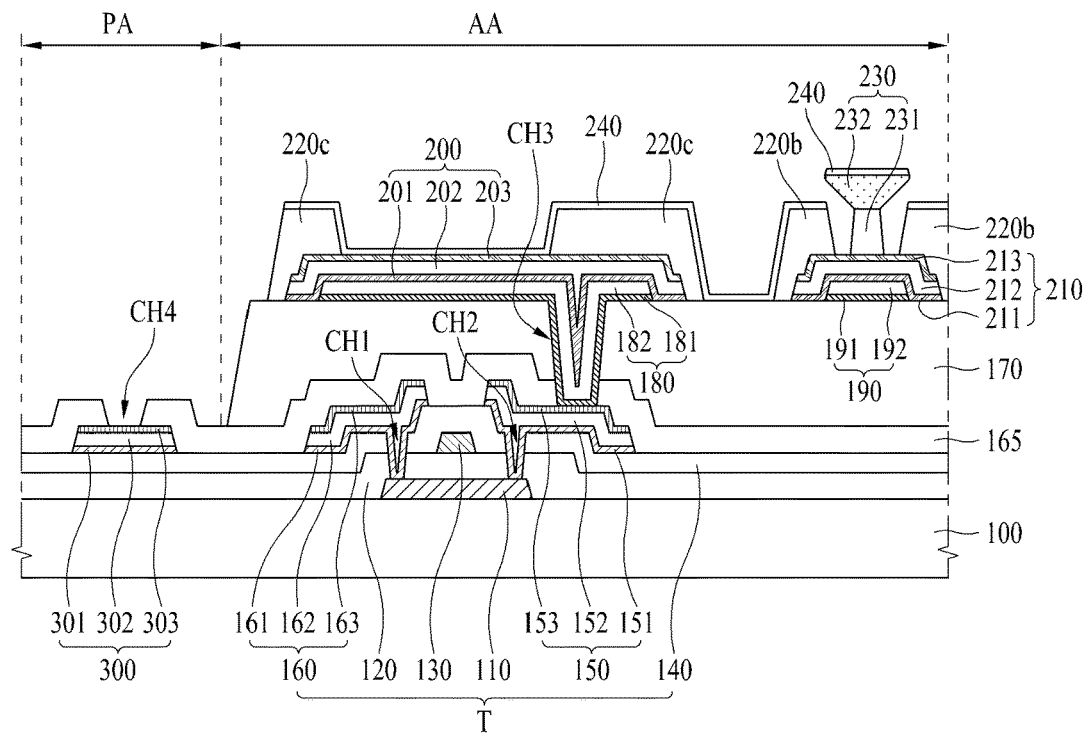

As shown in FIG. 5J, the organic emitting layer 240 is provided on the second anode electrode 200. The organic emitting layer 240 may be manufactured by an evaporation method using a deposition material with superior straightness. Thus, the organic emitting layer 240 is deposited on the upper surface of the bank 220b and 220c, the upper surface of the planarization layer 170 between the first bank 220b and the second bank 220c, the upper surface of the partition 230, however, the organic emitting layer 240 is not deposited in the space between the first bank 220b and the partition 230.

Figure 5K:
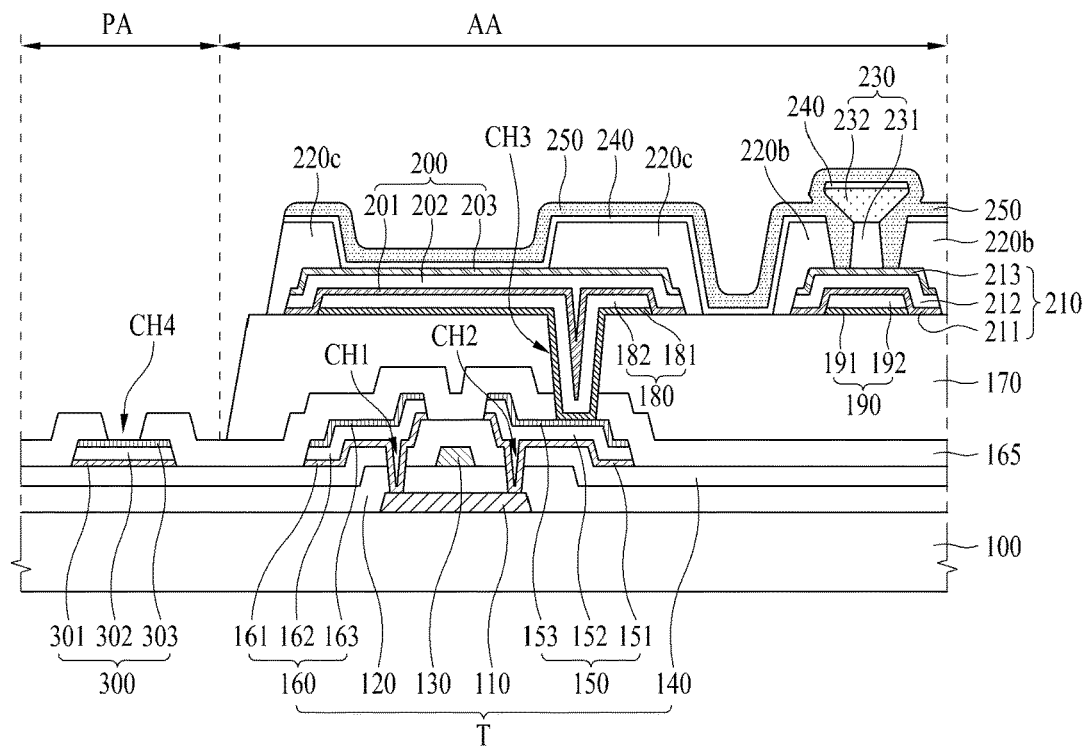

As shown in FIG. 5K, the cathode electrode 250 is provided on the organic emitting layer 240.

The cathode electrode 250 is connected with the second auxiliary electrode 210 through the space between the first bank 220b and the partition 230. The cathode electrode 250 may be manufactured by sputtering, that is, a deposition process with inferior straightness. Accordingly, the cathode electrode 250 may be deposited in the space between the partition 230 and the first bank 220b for the deposition process of the cathode electrode 250.

According to one embodiment of the present invention, instead of forming the pad electrode, the signal pad is provided under the passivation layer so that it is possible to prevent the lateral surface of the signal pad from being exposed, and furthermore, to prevent the lateral surface of the signal pad from being corroded.

According to one embodiment of the present invention, the signal pad includes the lower signal pad, the central signal pad, and the upper signal pad. Also, the central signal pad which is vulnerable to corrosion is surrounded by the lower signal pad, the upper signal pad, and the passivation layer, to thereby prevent the signal pad from being corroded.

According to one embodiment of the present invention, the two auxiliary electrodes of the first auxiliary electrode and the second auxiliary electrode are deposited in sequence so as to lower the resistance of the cathode electrode, whereby it is possible to control the resistance properties needed for the auxiliary electrode with easiness.

According to one embodiment of the present invention, the first partition, the bank, and the contact hole for exposing the signal pad are manufactured together by one mask process, to thereby reduce the mask process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A method of manufacturing an organic light emitting display device, the method comprising:
   providing a source electrode, a drain electrode and a signal pad on a substrate;
   providing a passivation layer on the source electrode, the drain electrode and the signal pad, providing a planarization layer on the passivation layer;
   providing an anode electrode connected with the source electrode or drain electrode, and providing an auxiliary electrode spaced apart from the anode electrode;
   providing a contact hole for exposing the signal pad by removing a predetermined portion of the passivation layer;
   providing a bank on one side and the other side of the anode electrode and one side and the other side of the auxiliary electrode;
   providing an organic emitting layer on the anode electrode; and
   providing a cathode electrode connected with the auxiliary electrode and provided on the organic emitting layer, wherein the signal pad includes a lower signal pad, a central signal pad and an upper signal pad, and the central signal pad is surrounded by the lower signal pad, the upper signal pad and the passivation layer, and wherein the anode electrode includes a first anode electrode, and a second anode electrode for covering upper and lateral surfaces of the first anode electrode.

2. The method according to claim 1, wherein the auxiliary electrode includes a first auxiliary electrode, and a second auxiliary electrode for covering upper and lateral surfaces of the first auxiliary electrode.

3. The method according to claim 2, wherein the process of providing the contact hole and the process of providing the bank are carried out by one mask process.

4. The method according to claim 3, wherein one mask process includes:

providing a photoresist pattern on the second anode electrode, the second auxiliary electrode, the planarization layer and the passivation layer;

providing the contact hole by removing the predetermined portion of the passivation layer under the condition that the photoresist pattern is used as a mask; and ashing the photoresist pattern and providing the bank by the photoresist pattern remaining after the ashing.

5. The method according to claim 4, wherein the photoresist pattern includes an area having a first thickness, and an area having a second thickness less than the first thickness, wherein the area having the first thickness corresponds to one side and the other side of the second anode electrode, one side and the other side of the second auxiliary electrode, and a predetermined portion of a central area of the second auxiliary electrode, and the photoresist pattern remaining after the ashing corresponds to the area having the first thickness.

6. The method according to claim 2, wherein the process of providing the second anode electrode and the second auxiliary electrode, the process of providing the contact hole and the process of providing the bank are carried out by one mask process.

7. The method according to claim 6, wherein one mask process includes:

providing a second electrode layer on an entire surface of the substrate including the first anode electrode and the first auxiliary electrode;

providing a photoresist pattern on the second electrode layer;

providing the second anode electrode and the second auxiliary electrode by patterning the second electrode layer under the condition that the photoresist pattern is used as a mask, and providing the contact hole by removing the predetermined portion of the passivation layer under the condition that the photoresist pattern is used as a mask; and ashing the photoresist pattern and providing the bank by the photoresist pattern remaining after the ashing.

8. The method according to claim 7, further comprising:

removing the second electrode layer remaining on the photoresist pattern after the second electrode layer is patterned by using the photoresist pattern as the mask, wherein the process of providing the bank by using the remaining photoresist pattern includes the process of connecting the bank and the planarization layer with each other by a thermal reflow process.

9. The method according to claim 2, further comprising: providing a partition, which is spaced apart from the bank, on the second auxiliary electrode, wherein the process of providing the partition includes providing a first partition on the second auxiliary electrode, and providing a second partition on the first partition, and the process of providing the first partition and the process of providing the bank are carried out at the same time, and wherein the organic emitting layer is not deposited in the space between the bank and the partition, and the cathode electrode is deposited in the space between the bank and the partition.

10. The method according to claim 1, further comprising:

providing a first bank on one side and the other side of the auxiliary electrode; and providing a partition provided on the auxiliary electrode and spaced apart from the first bank, wherein the cathode electrode is connected with the auxiliary electrode via the space between the first bank and the partition.

11. The method according to claim 10, further comprising:

providing a second bank on one side and the other side of the anode electrode, wherein the first bank and the second bank are spaced apart from each other, wherein the planarization layer is exposed via the space between the first bank and the second bank, and the organic emitting layer is provided on an upper surface of the exposed planarization layer.

12. A method of manufacturing an organic light emitting display device, the method comprising:

providing a source electrode and a drain electrode on a substrate;

providing a passivation layer on the source electrode and the drain electrode, providing a planarization layer on the passivation layer;

providing an anode electrode connected with the source electrode or drain electrode, and providing an auxiliary electrode spaced apart from the anode electrode;

providing a bank on one side and the other side of the anode electrode and one side and the other side of the auxiliary electrode;

providing an organic emitting layer on the anode electrode; and providing a cathode electrode connected with the auxiliary electrode and provided on the organic emitting layer, wherein the auxiliary electrode includes a first auxiliary electrode, and a second auxiliary electrode on the first auxiliary electrode, and the second auxiliary electrode extends from an upper surface of the first auxiliary electrode to a lateral surface of the first auxiliary electrode, and the second auxiliary electrode is provided to cover the lateral surface of the first auxiliary electrode.

13. The method according to claim 12, wherein the second auxiliary electrode is provided to entirely cover the upper and lateral surfaces of the first auxiliary electrode.

14. The method according to claim 12, wherein the second auxiliary electrode includes a second lower auxiliary electrode, a second central auxiliary electrode and a second upper auxiliary electrode, and the second lower auxiliary electrode contacts the upper and lateral surfaces of the first auxiliary electrode.

15. The method according to claim 14, wherein the second central auxiliary electrode is provided to cover the upper and lateral surfaces of the first auxiliary electrode.

16. The method according to claim 14, wherein the first auxiliary electrode includes a first lower auxiliary electrode and a first upper auxiliary electrode, and the second lower auxiliary electrode contacts a lateral surface of the first lower auxiliary electrode and a lateral surface of the first upper auxiliary electrode.

17. The method according to claim 12, wherein the anode electrode includes a first anode electrode, and a second anode electrode on the first anode electrode, and the second anode electrode extends from an upper surface of the first anode electrode to a lateral surface of the first anode electrode.

18. The method according to claim 17, wherein a material of the first anode electrode is same as a material of the first auxiliary electrode, and a material of the second anode electrode is same as a material of the second auxiliary electrode.

19. A method of manufacturing an organic light emitting display device, the method comprising:
 providing a source electrode, a drain electrode and a signal pad on a substrate;
 providing a passivation layer on the source electrode, the drain electrode and the signal pad, providing a planarization layer on the passivation layer;
 providing an anode electrode connected with the source electrode or drain electrode, and providing an auxiliary electrode spaced apart from the anode electrode;
 providing a contact hole for exposing the signal pad by removing a predetermined portion of the passivation layer;
 providing a bank on one side and the other side of the anode electrode and one side and the other side of the auxiliary electrode;
 providing an organic emitting layer on the anode electrode; and
 providing a cathode electrode connected with the auxiliary electrode and provided on the organic emitting layer,
 wherein the signal pad includes a lower signal pad, a central signal pad on the lower signal pad, and an upper signal pad on the central signal pad, and the source electrode includes a lower source electrode, a central source electrode on the lower source electrode, and an upper source electrode on the central source electrode, and
 wherein the auxiliary electrode includes a first auxiliary electrode, and a second auxiliary electrode for covering upper and lateral surfaces of the first auxiliary electrode.

20. The method according to claim 19, further comprising:
 providing a gate electrode and an insulating interlayer between the gate electrode and the source electrode, wherein the signal pad contacts an upper surface of the insulating interlayer, and
 wherein a material of the lower signal pad is same as a material of the lower source electrode, a material of the central signal pad is same as a material of the central source electrode, and a material of the upper signal pad is same as a material of the upper source electrode.

\* \* \* \* \*